United States Patent [19]
Brown et al.

[11] Patent Number: 5,981,148
[45] Date of Patent: Nov. 9, 1999

[54] METHOD FOR FORMING SIDEWALL SPACERS USING FREQUENCY DOUBLING HYBRID RESIST AND DEVICE FORMED THEREBY

[75] Inventors: Jeffrey S. Brown, Jeffersonville; James S. Dunn, Jericho; Steven J. Holmes, Milton; Cuc K. Huynh, Jericho; Robert K. Leidy, Burlington; Paul W. Pastel, Essex, all of Vt.

[73] Assignee: International Business Machines Corporation, Armonk, N.Y.

[21] Appl. No.: 08/895,749

[22] Filed: Jul. 17, 1997

[51] Int. Cl.⁶ .............................. G03C 5/56; H01L 21/71
[52] U.S. Cl. .................... 430/314; 430/313; 430/316; 430/312; 438/696
[58] Field of Search .................... 430/312, 313, 430/314, 316, 317, 394; 438/303; 216/46

[56] References Cited

U.S. PATENT DOCUMENTS

| | | | |
|---|---|---|---|
| 4,997,746 | 3/1991 | Greco et al. | 430/314 |
| 5,166,771 | 11/1992 | Godinho et al. | 257/368 |
| 5,244,759 | 9/1993 | Pierrat | 430/312 |
| 5,275,896 | 1/1994 | Garofalo et al. | 430/313 |
| 5,308,721 | 5/1994 | Garofalo et al. | 430/313 |
| 5,486,449 | 1/1996 | Hosono et al. | 430/313 |
| 5,610,099 | 3/1997 | Stevens et al. | 437/192 |
| 5,741,624 | 4/1998 | Jeng et al. | 430/312 |
| 5,776,660 | 7/1998 | Hakey et al. | 430/296 |

*Primary Examiner*—Janet Baxter
*Assistant Examiner*—Jill N. Holloman
*Attorney, Agent, or Firm*—Schmeiser, Olsen & Watts; Eugene I. Shkurko

[57] ABSTRACT

The preferred embodiment of the present invention overcomes the disadvantages of the prior art by using hybrid resist to define a sidewall spacer region and form a new type of sidewall spacer. The preferred method allows for more controlled doping at the gate-source and gate-drain junctions by defining sidewall spacer troughs using hybrid resist. Implants can then be made through the troughs to precisely control the doping at the gate junctions. Additionally, sidewall spacers can then be formed in the sidewall spacer troughs. The dimensions of the sidewall spacers is determined by the hybrid resist and can thus be made smaller than traditional resist processes. Additionally, forming the sidewall spacers using hybrid resist allows for their width to be determined independent of the depth of the gate material.

27 Claims, 30 Drawing Sheets

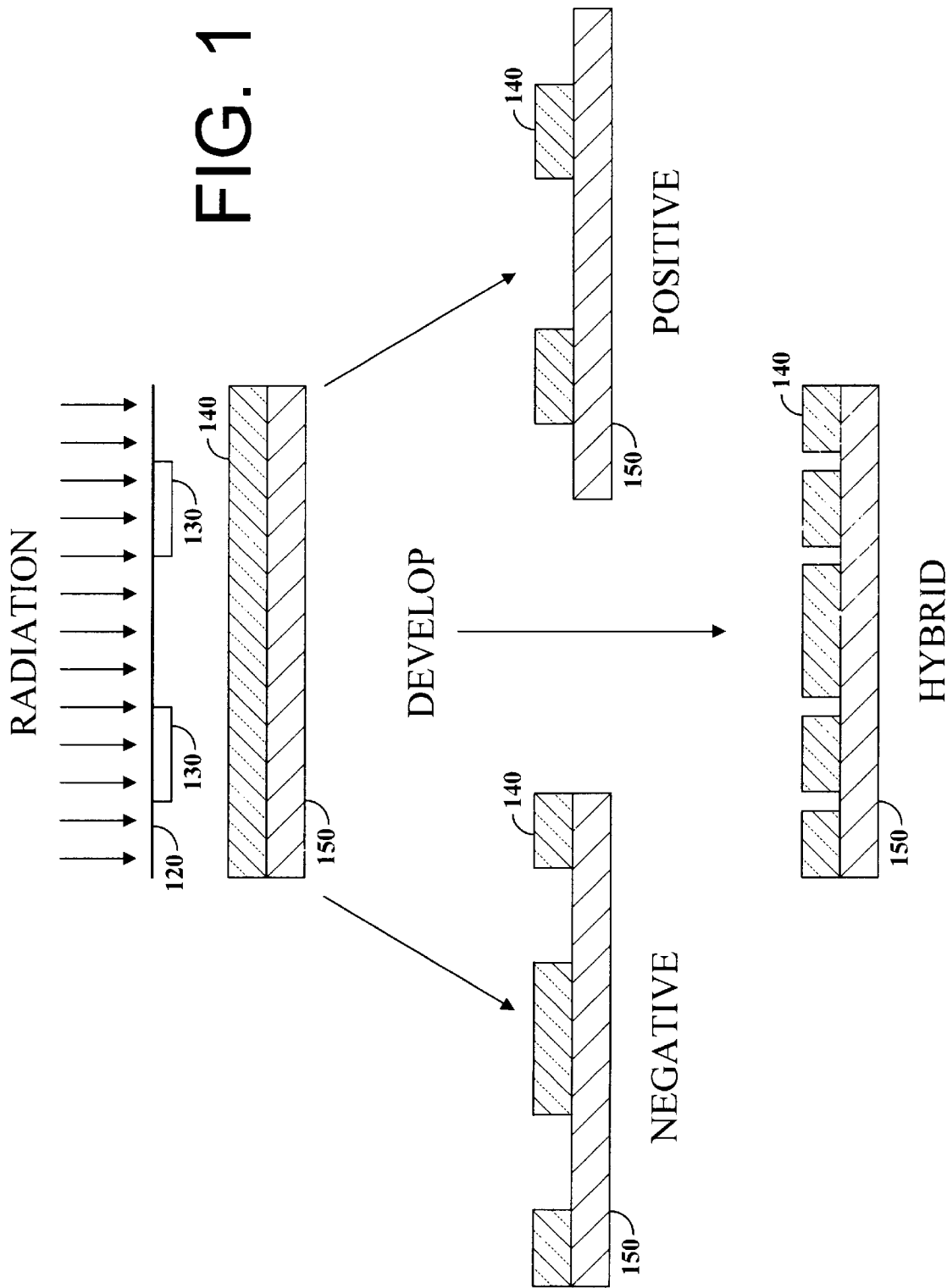

METHOD FOR FORMING SIDEWALL SPACERS USING FREQUENCY DOUBLING HYBRID RESIST AND DEVICE FORMED THEREBY

RELATED APPLICATIONS

This application is related to the following U.S. Patent applications: "Method of Photolithographically Defining Three Regions with One Mask Step and Self-Aligned Isolation Structure Formed Thereby," Ser. No. 08/895,748, filed this same day; "Low 'K' Factor Hybrid Photoresist," Ser. No. 08/715,288, Docket No. FI9-96-055; and "Frequency Doubling Photoresist," Ser. No. 08/715,287, Docket No. BU9-96-047, both filed Sep. 16, 1996.

BACKGROUND OF THE INVENTION

1. Technical Field

The present invention relates generally to the field of semi-conductor manufacturing and, more specifically, to a method for forming sidewall spacers in field effect transistors.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in CMOS technologies, such as the in the design and fabrication of field effect transistors (FETs). FETs are used in almost all types of integrated circuit design (i.e., microprocessors, memory, etc.) One of the bedrock technologies that has allowed FETs to be widely used is the use of gate sidewall spacers. Typical sidewall spacers are formed using a conformal deposition of a spacer material over the gate structure, followed by a directional etch, as disclosed in Pogge, U.S. Pat. No. 4,256,514, "Method for Forming a Narrow Dimensioned Region on a Body," assigned to International Business Machines, Inc. The directional etch removes all the spacer material from the horizontal surfaces, but leaves "spacers" at the sidewalls of the gates. Turning to FIGS. 38 and 39, a prior art sidewall spacer is illustrated. As illustrated in FIG. 38, sidewall spacer material 3804 is conformally deposited over a gate 3802 on a wafer 3800. By directionally etching the sidewall spacer material, sidewall spacers 3902 remain adjacent the gate 3802. These spacers are inherently self-aligned with the gate. By implanting, forming the sidewall spacers, and then implanting again, the areas of the wafer closest to the gate edge can be doped less than the other active regions. Thus, sidewall spacers allow for a lighter doped region to be formed at the gate edge with the width of that region defined by the width of the spacer.

Unfortunately, the sidewall spacers has several limitations. First, sidewall spacer technology has a limited ability to be scaled to smaller dimensions. In particular, the maximum width of a spacer created by this process is the height of the vertical structure it adjoins. Thus, in polysilicon gate applications the thickness of the gate polysilicon cannot scale downwards without also making the sidewall spacers smaller. If the sidewall spacers are made too small, silicide may bridge across the spacer is subsequent processing steps, and thus form unwanted shorts.

Second, the prior art sidewall spacers provide limited ability to selectively dope the gate-source and gate-drain transitions. In particular, the prior art only had the ability to implant across the entire active area (except where blocked by the gate), then form the sidewall spacer, and implant again across the entire active area (except where blocked by the gate and sidewall spacers). Thus, any dopant added to the gate edge also had to be added across the entire active area. This severely limited the type of implants that could be made.

For example, forming an implant across the entire active region to increase the background doping can help prevent punchthru at the device channel, but by implanting across the entire active region it will also undesirably affect the parasitic capacitances of the source and drain regions.

Third, traditional methods of creating a sidewall spacer can create pattern density effects at the gate polysilicon etch which can cause increased across chip linewidth variation. In particular, because the etch methods used today use a low pressure, the etch rate is determined in part by the amount of available reactant species. If there is a region where most everything is being etched, the reactants will be consumed quickly relative to the regions where most of the material is protected by photoresist. This causes across the across chip linewidth variation.

Thus, there was a need for improved method of fabricating field effect transistors and resulting improved FET structures.

DISCLOSURE OF INVENTION

Accordingly, the present invention provides a photoresist material having, simultaneously, both a positive tone and a negative tone response to exposure. This combination of materials can provide a new type of resist, which we call a hybrid resist.

Additionally, the present invention provides a method for defining a sidewall spacer region and forming a new type of sidewall spacer that overcomes the disadvantages of the prior art. In particular, the preferred method allows for more controlled doping at the gate-source and gate-drain junctions by defining sidewall spacer troughs using hybrid resist. Implants can then be made through the troughs to precisely control the doping at the gate junctions. Additionally, sidewall spacers can then be formed in the sidewall spacer troughs. The dimensions of the sidewall spacers is determined by the hybrid resist and can thus be made smaller than traditional resist processes. Additionally, forming the sidewall spacers using hybrid resist allows for their width to be determined independent of the depth of the gate material.

The present invention can be used in a wide variety of applications. In particular, the preferred embodiment can be applied form the sidewall spacers and form edge implants in a field effect transistor.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and FIG. 1 is a schematic diagram showing the use of the hybrid resist;

BEST MODE FOR CARRYING OUT THE INVENTION

Figure 3:
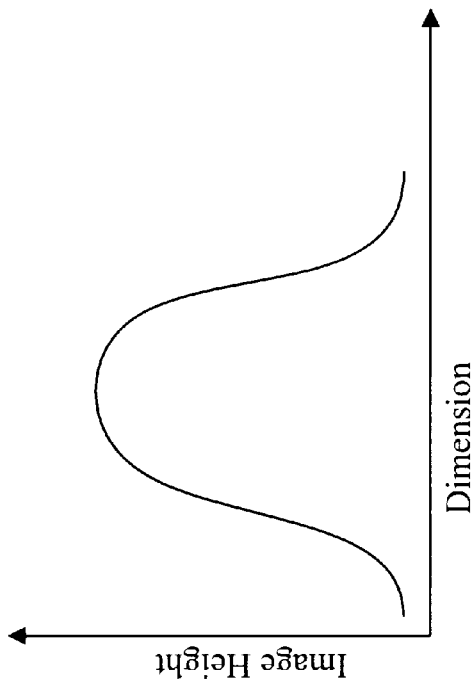
FIG. 3 is a graph illustrating the line pattern for positive resist printed with a reticle line pattern.

The preferred embodiment of the present invention overcomes the limitations of the prior art and provides a method to form define sidewall spacer regions and form sidewall spacers. The preferred embodiment uses hybrid resist which exhibits both positive and negative tone responses as well as an intermediate response to define and form the sidewall spacer regions. A description of hybrid resist will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.2 $\mu$m and less can be printed with current deep ultra violet (DUV) lithography tools that are designed for operation at 0.35 $\mu$m resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2 $\mu$m feature with conventional resist generally requires a 0.2 $\mu$m reticle image size. With hybrid resist, a 0.2 $\mu$m space can be formed with a single edge of a reticle feature; for example, a 0.5 $\mu$m reticle opening could produce two 0.2 $\mu$m spaces and a 0.2 $\mu$m line. In this way, one could accomplish 'reduction' x-ray or E-beam lithography; the reticle image pitch could be approximately 2× the printed pitch on the substrate. This also has the additional advantage of allowing a relaxation of the image size requirements of optical reticles, reducing cost and improving yield of the reticle. It is an advantage of hybrid resist that lines and spaces of 0.2 $\mu$m and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

Figure 2:
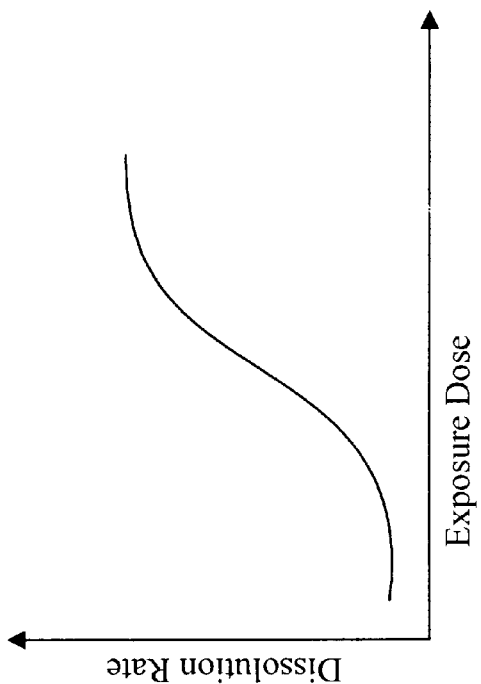
FIG. 2 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 2, a graph is illustrated showing how positive resist undergoes an increase in solubility as the exposure dose is increased. Turning to FIG. 3, the line pattern for positive resist printed with a reticle line pattern is illustrated.

Figure 5:
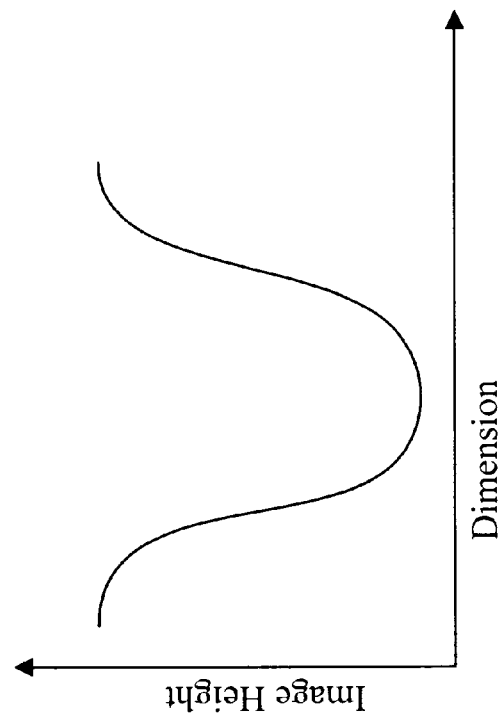
FIG. 5 is a graph illustrating the line pattern for negative resist printed with a reticle line pattern.
Figure 4:
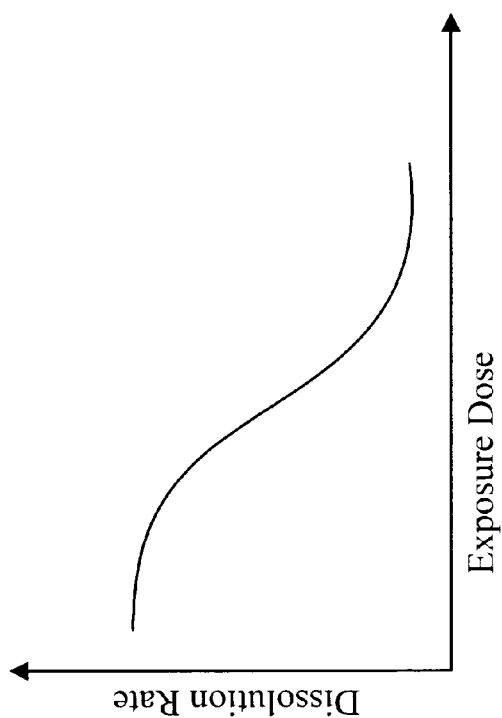
FIG. 4 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 4. Turning to FIG. 5, the line pattern for negative resist printed with a reticle line pattern is illustrated.

Figure 7:
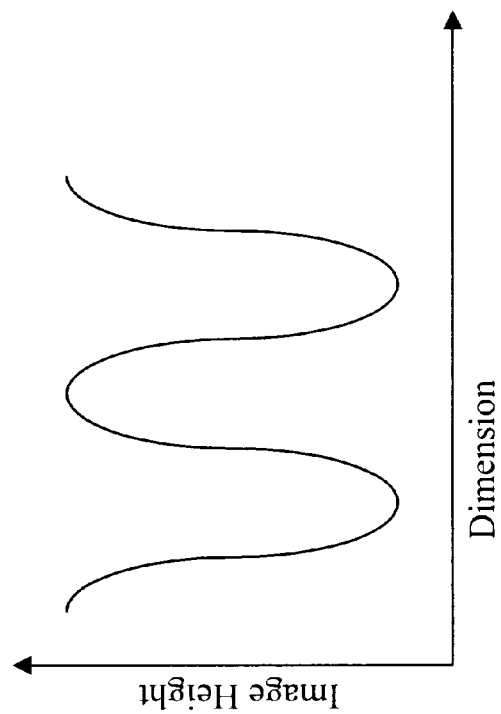
FIG. 7 is a graph illustrating the space/line/space pattern formed onto a substrate using hybrid resist.
Figure 6:
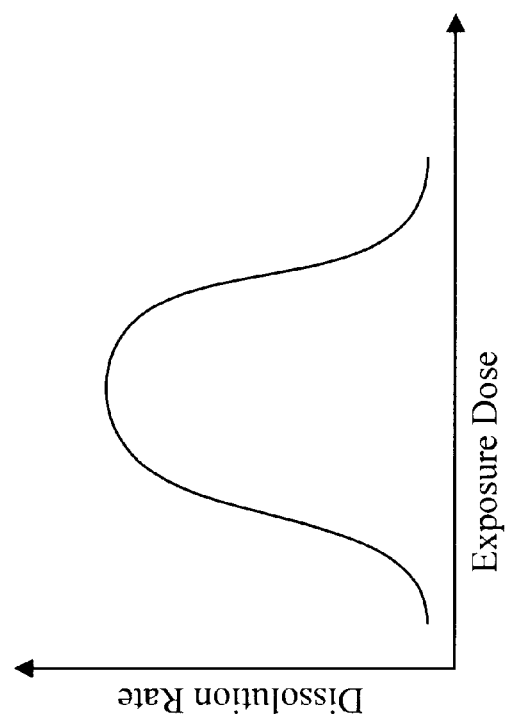
FIG. 6 is a graph of the resist solubility as a function of exposure dose for hybrid resist.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 6, the graph of the resist solubility as a function of exposure dose for hybrid resist is illustrated. Printing a reticle line pattern onto a substrate results in the space/line/space pattern illustrated in FIG. 7.

In this manner, the aerial image is "frequency doubled" to produce twice the number of features than would otherwise be attainable with the standard resist. FIG. 1 illustrates these salient differences between a positive resist, a negative resist, and a hybrid resist. In FIG. 1, a hybrid photoresist 140 has been deposited over the surface of substrate 150. A mask 120 with chrome areas 130 is used to selectively mask portions of photoresist 140 from a radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 1, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
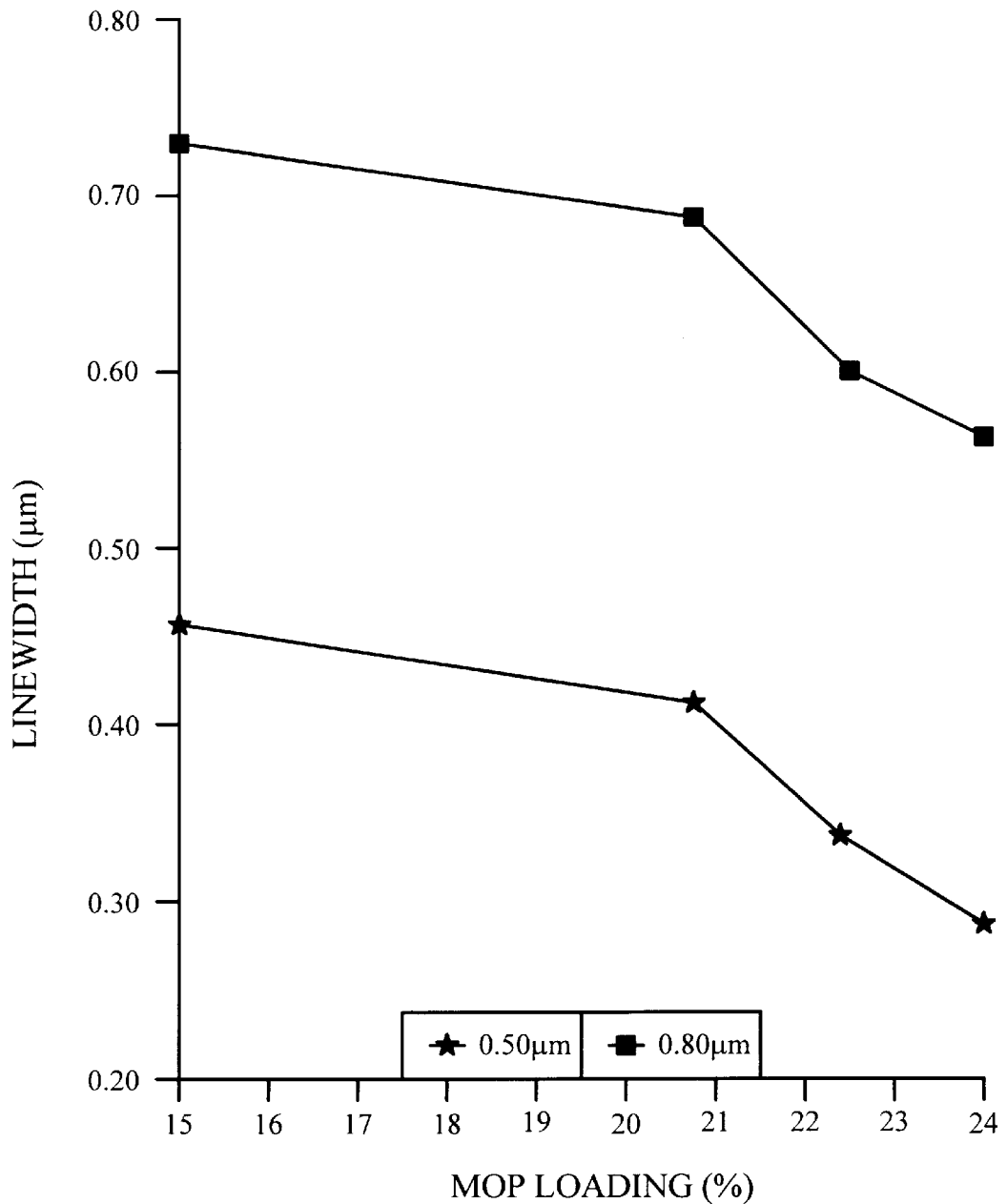
FIG. 10 is a graph showing the linewidth in nm plotted against the amount of positive tone solubility inhibitor (MOP) incorporated in a hybrid resist of the present invention.
Figure 15:
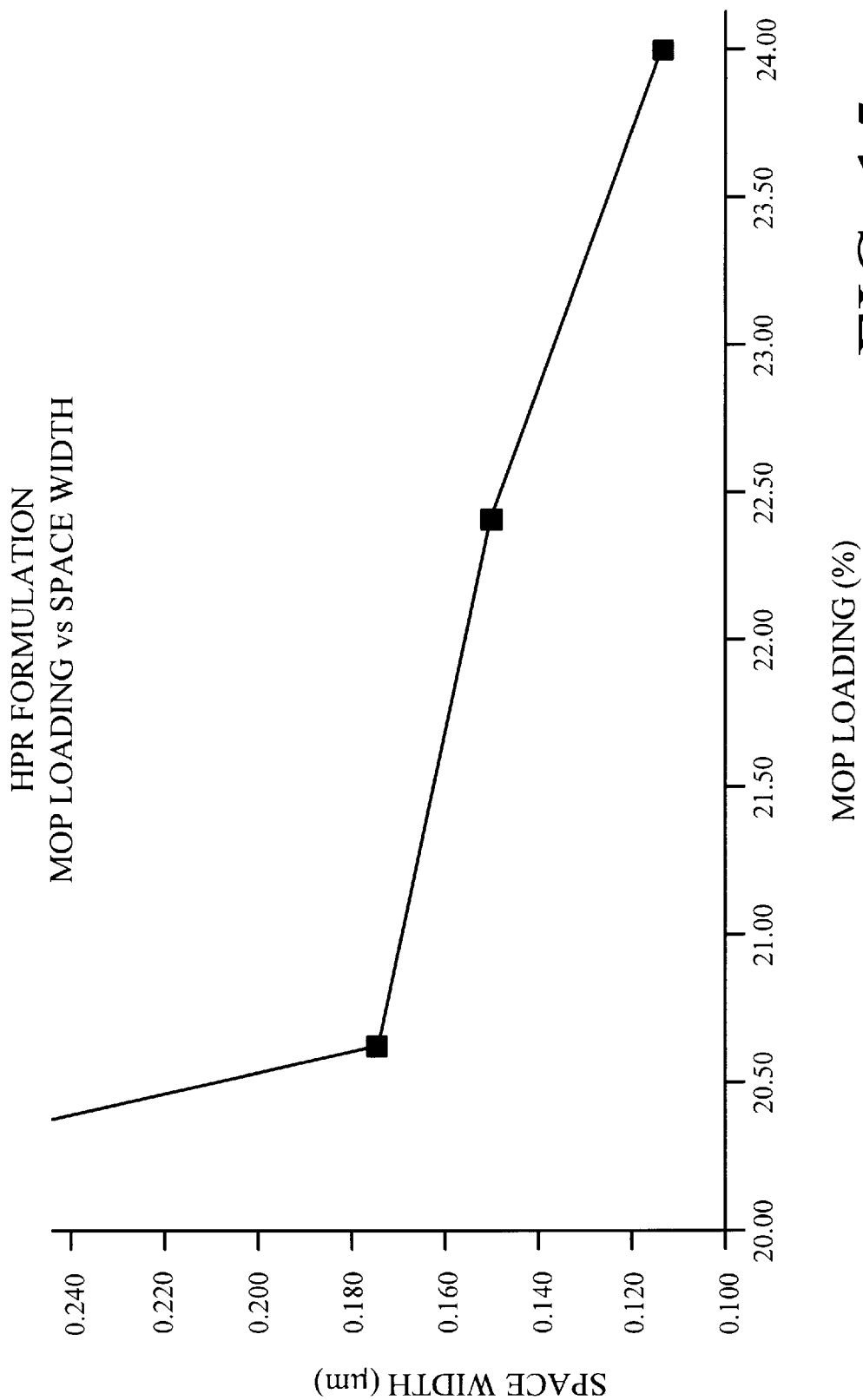
FIG. 15 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
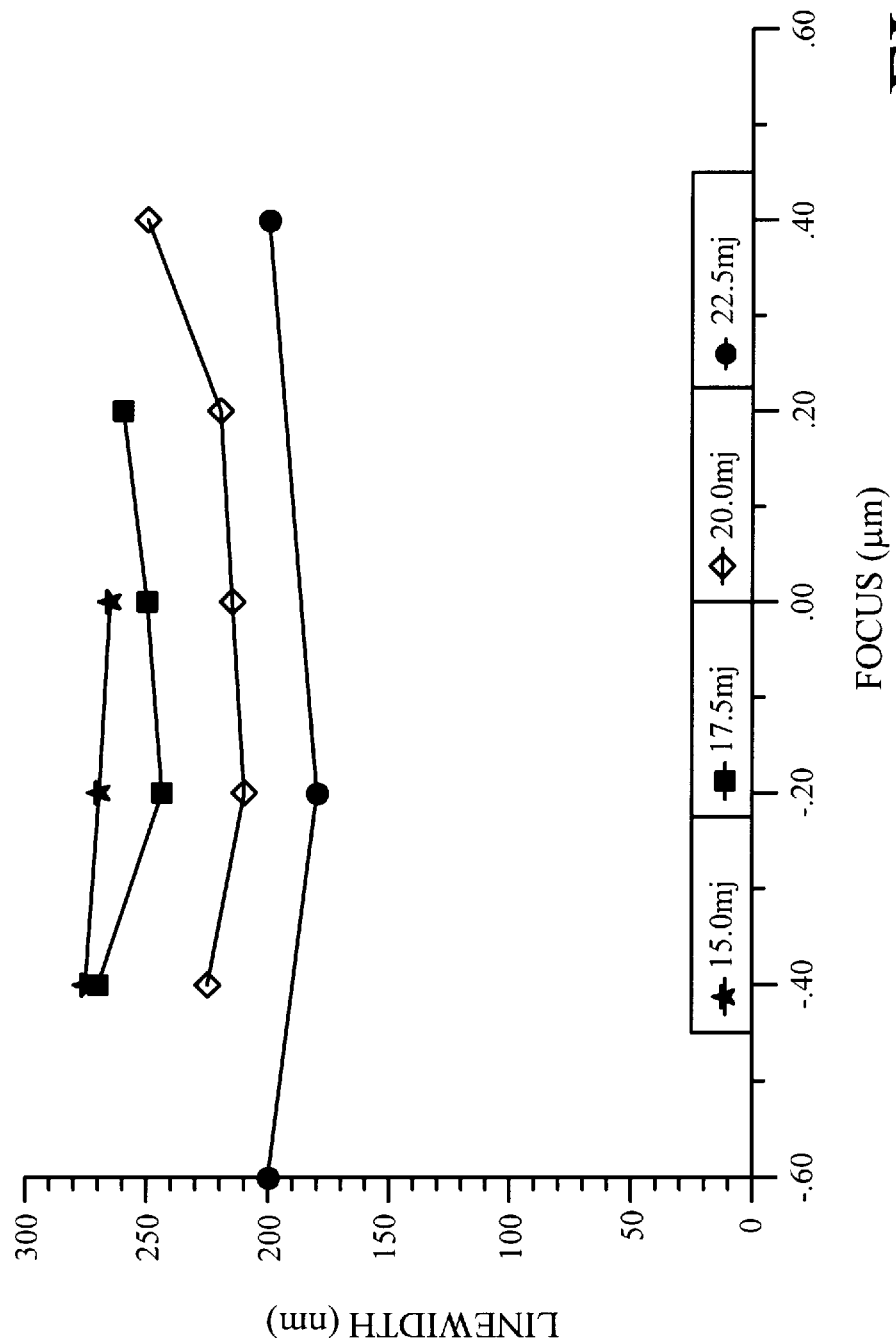
FIG. 8 is a graph of linewidth in nanometers (nm) plotted against focus in microns ($\mu$m) of a formulation of a standard negative resist at various exposure energies.
Figure 9:
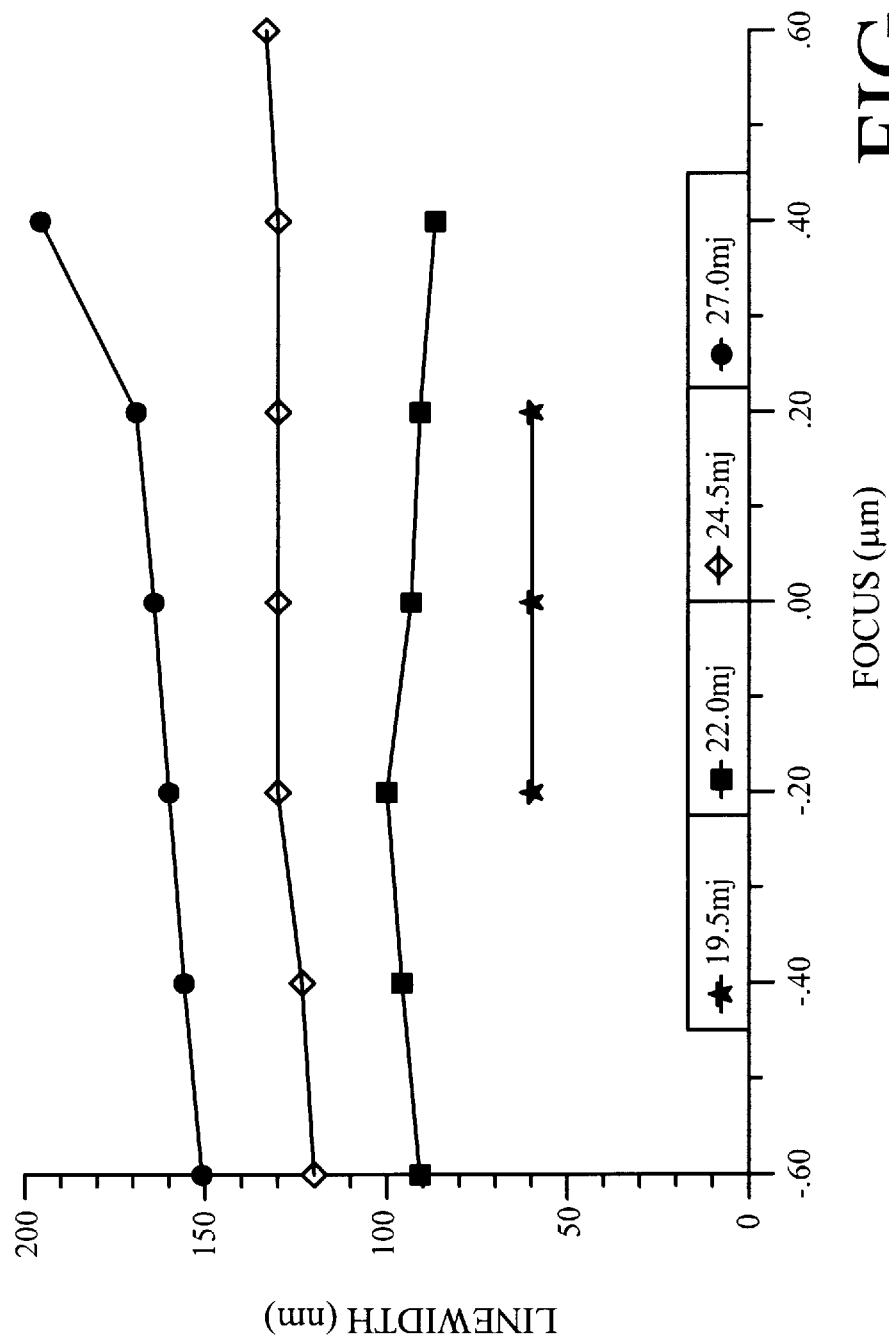
FIG. 9 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 8. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
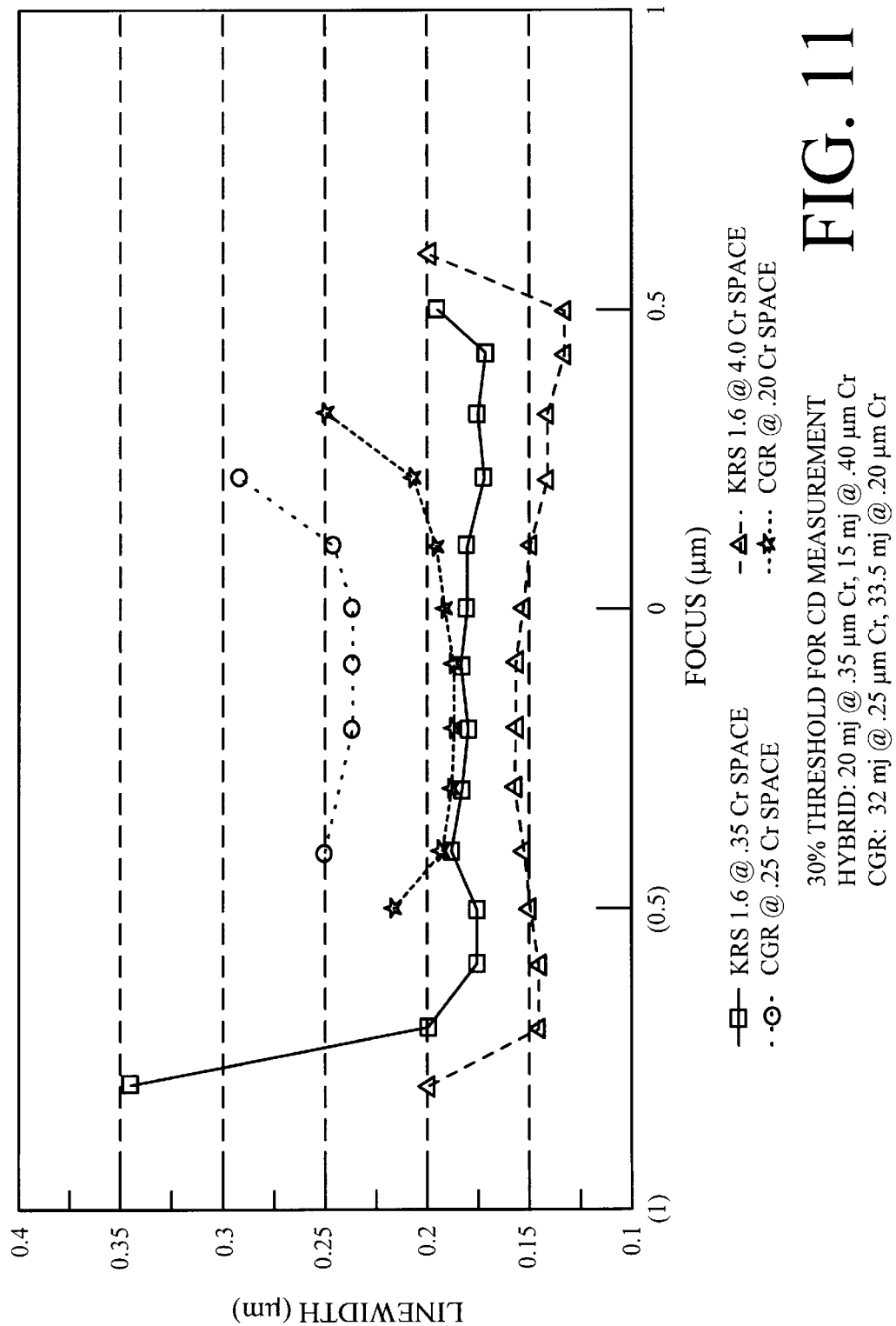
FIG. 11 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 μm larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi; Tex., novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydride copolymers, polyhydroxystyrene-p-tertiarybutyl-carganatostyrene copolymers, poly(2-hydroxystyrene), phenol-formaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

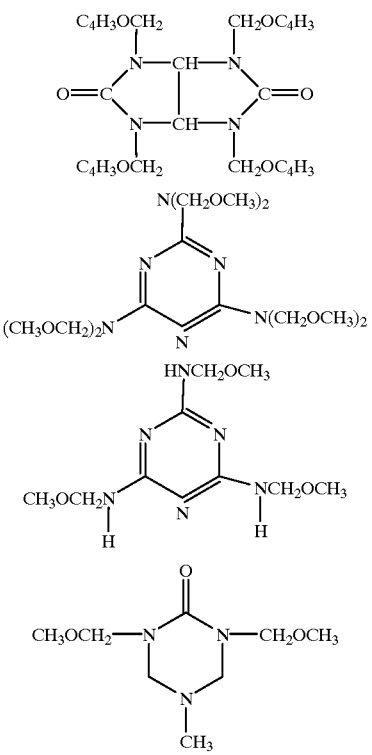

-continued

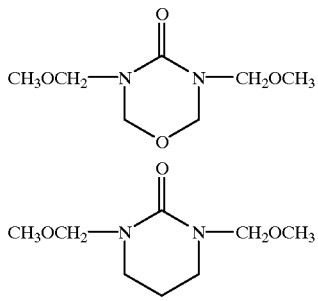

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylatedbutylated glycol-urils, for example of the formula:

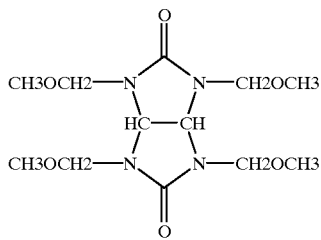

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propyleneglycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1]-hept-5-ene-2,3-dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0.1% of solids.

The solution was filtered through a 0.2 μm filter. The solution was coated onto silicon wafers primed with hexamethyl-disilazane with a soft bake of 110° Celsius (C.) resulting in films of about 0.8 μm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 millijoule (mJ) to about 3 mJ. Increasing the dose further, the negative cross-linking chemistry becomes predominant and the dissolution rate falls back to a value close to zero.

Figure 13:
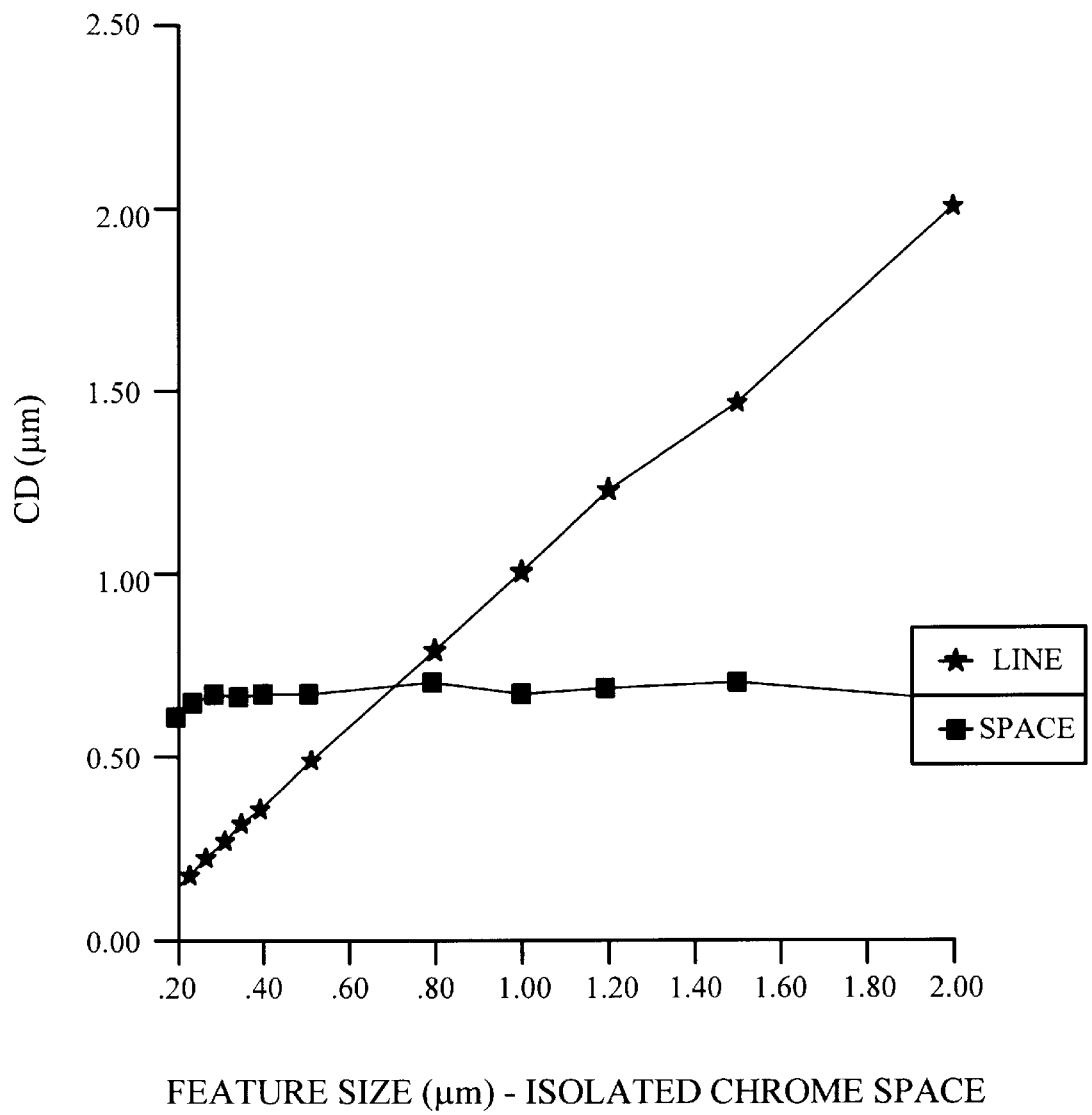
FIG. 13 is a graph showing the resultant line and space widths as functions of the chrome space width using one formulation of a hybrid resist of the present invention.

In another experiment with the same resist, when a MICRASCAN II 0.5 NA DUV stepper is used to expose an isolated chrome space onto the hybrid resist film, the space/ line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids;

Powderlink, 7.8% of solids;

tetrabutyl ammonium hydroxide base, 0.1% of solids; and sufficient PM acetate containing 350 ppm FC-430 surfactant as a solvent to form a 18.9% solids solution.

Figure 12:
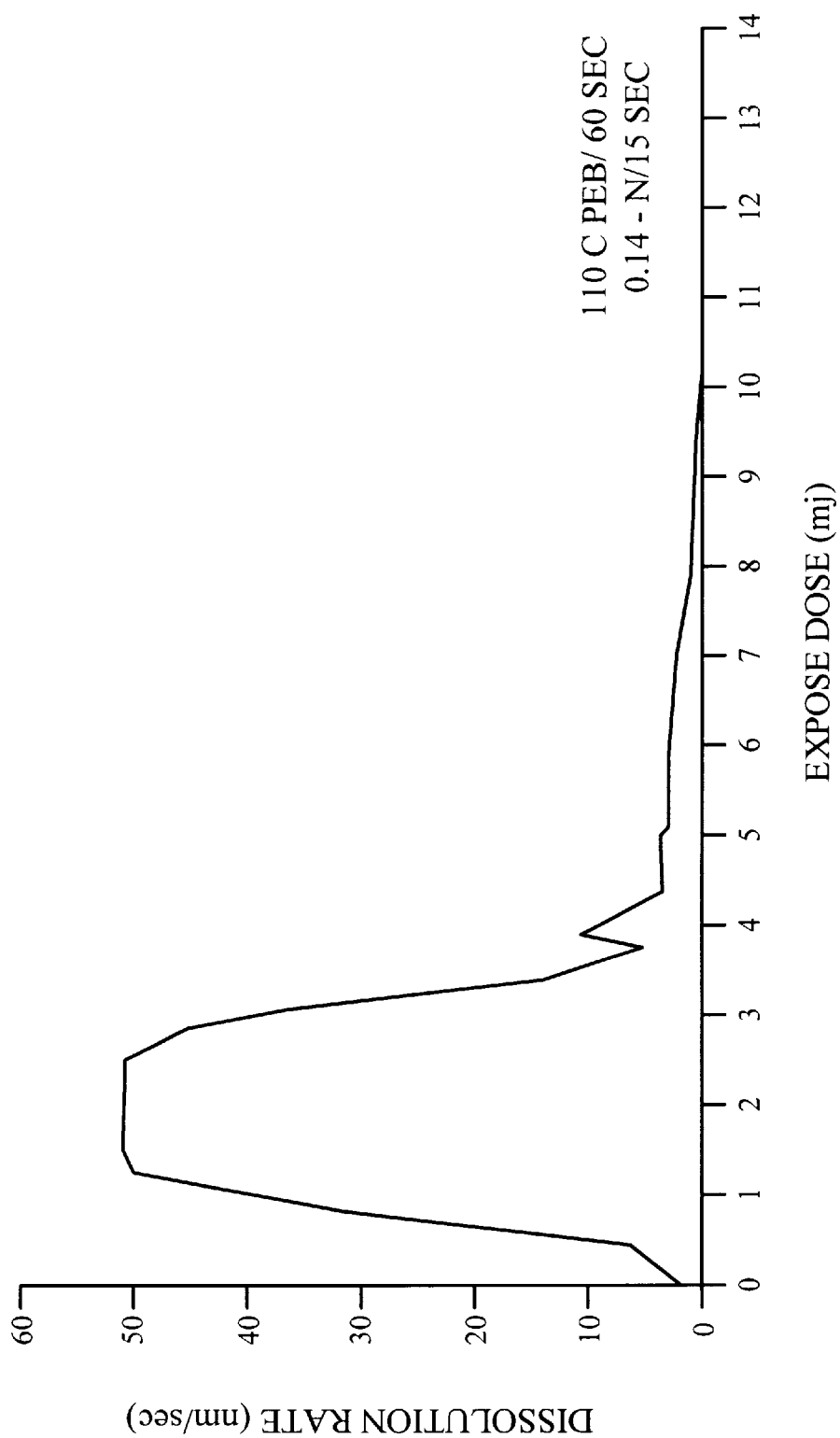
FIG. 12 is a graph showing the dissolution rate in nanometers per second (nm/sec) as a function of the exposure dose in millijoules (mJ) using one formulation of a hybrid resist of the present invention.
Figure 14:
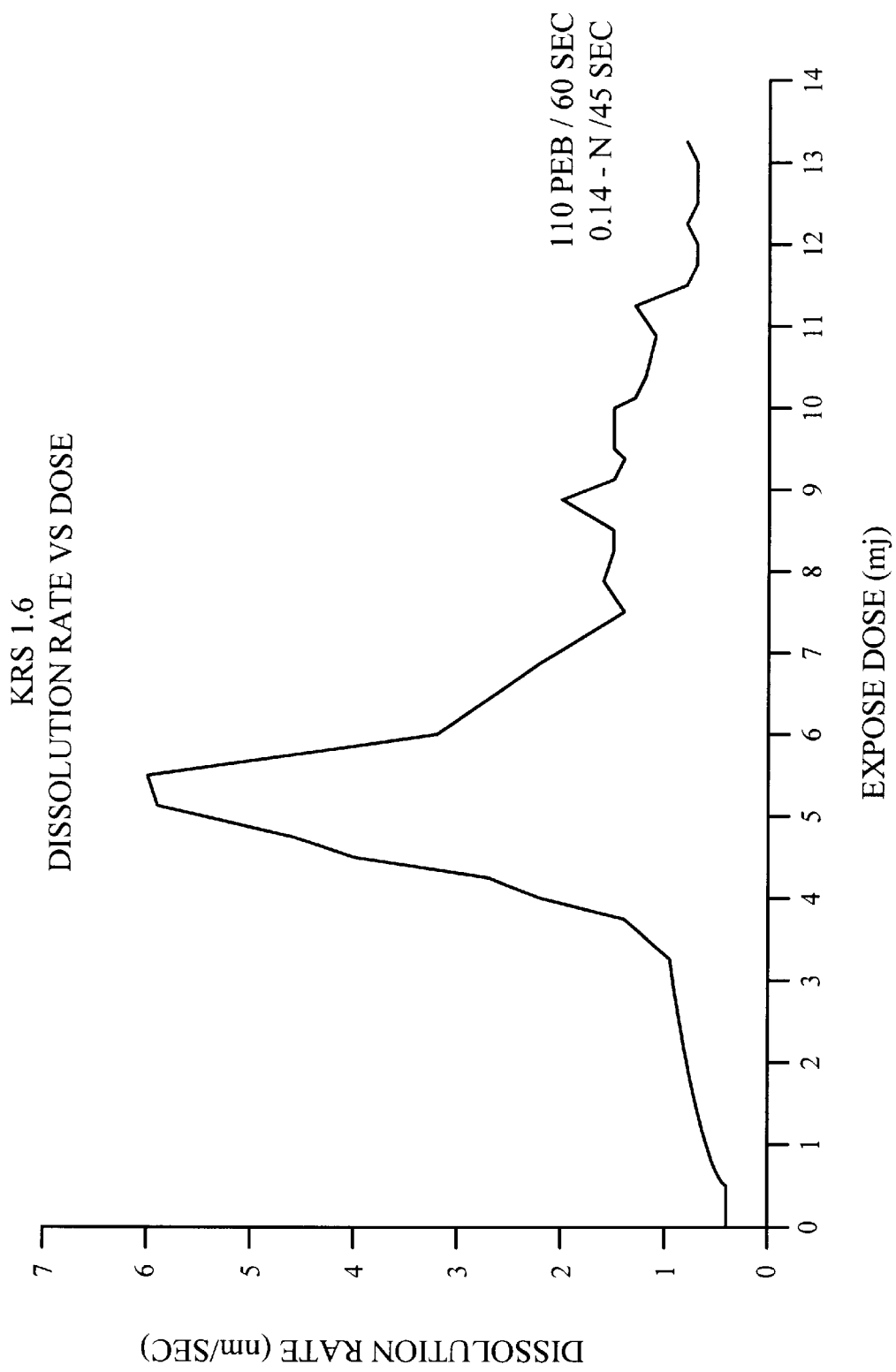
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

Figure 16:
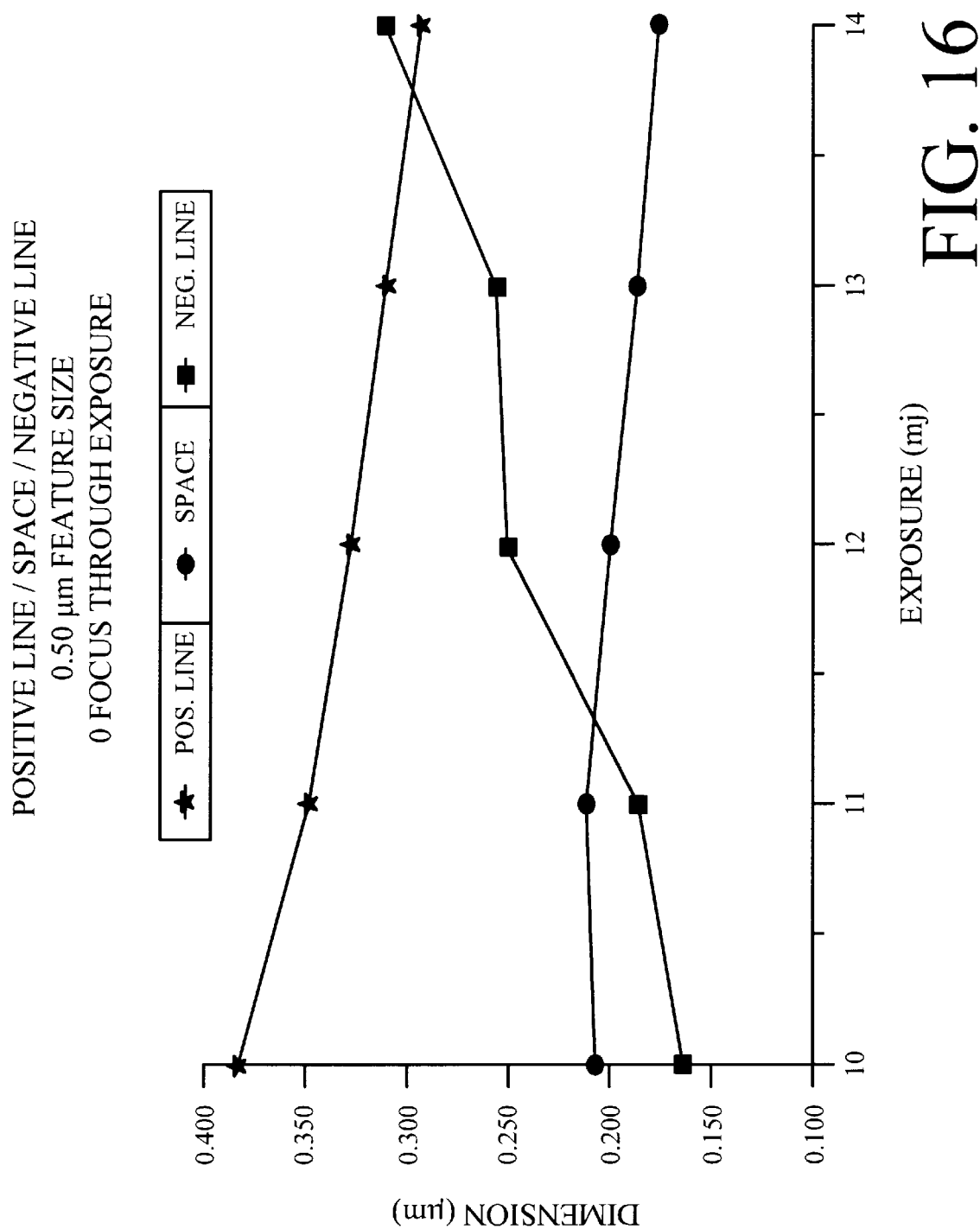
FIG. 16 is a graph of the response of a formulation of the hybrid resist of the present invention in which exposed (negative) line, unexposed (positive) line and space widths are plotted as a function of exposure dose.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of exposure dose. The space remains relatively constant in the range of about 0.18 $\mu$m, whereas both lines vary as the exposure dose is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 $\mu$m. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5 NA DUV expose system. Silicon wafers (200 mm) with a 2000 Angstrom (A) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter ($cm^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 $\mu$m was observed for the hybrid resist relative to the standard negative resist, as calculated using standard methods known in the art.

PREFERRED EMBODIMENTS

The preferred embodiments capitalize on the unique properties of hybrid resist to form a field effect transistor. In particular, the preferred embodiments define a sidewall spacer region and form a new type of sidewall spacer that overcomes the disadvantages of the prior art. In particular, the preferred method allows for more controlled doping at the gate-source and gate-drain junctions by defining sidewall spacer regions using hybrid resist. In addition, by using hybrid resist the preferred embodiments allow for a sidewall spacer to be formed that has a width that is not determined by the depth of the gate material.

Figure 17:
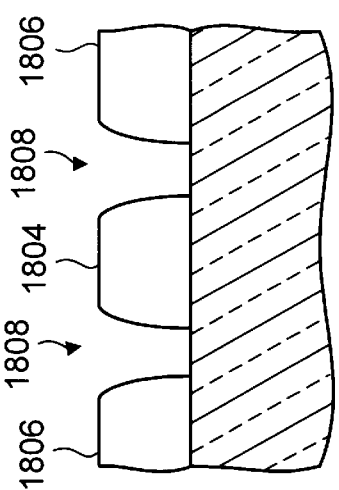
FIG. 17 is a schematic view of an exemplery mask portion.
Figure 19:
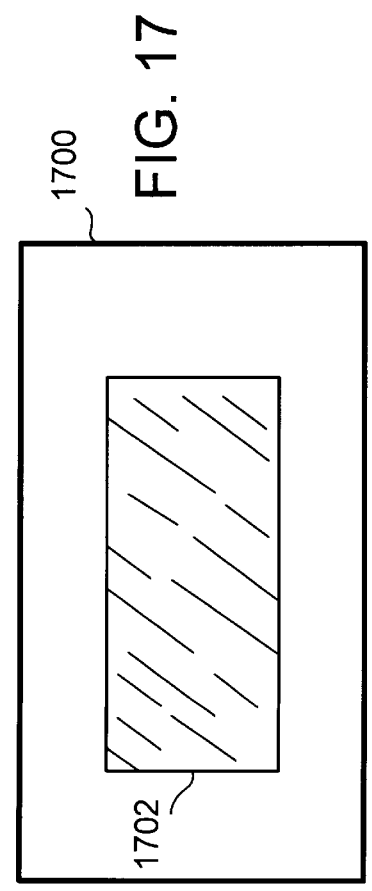
FIG. 19 is a cross-sectional side view of the wafer portion of FIG. 18 taken along line 19—19.
Figure 20:
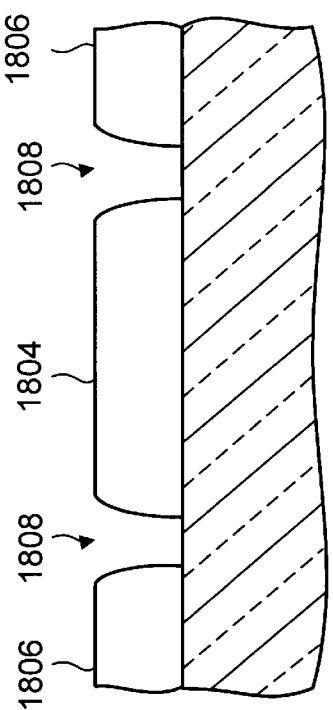
FIG. 20 is a cross-sectional side view of the wafer portion of FIG. 18 taken along line 20—20.

When hybrid resist is exposed to actinic energy, areas of the resist which are subject to a full exposure form a negative tone line pattern, areas which are unexposed form a positive tone pattern, and areas which are exposed to intermediate amounts of radiation become soluble and wash away during development. Turning to FIG. 17, an exemplary mask 1700 containing a mask blocking shape 1702 is illustrated. When hybrid resist is deposited on a wafer, exposed through mask 1700 with actinic radiation, and developed, the mask 1700 creates the a "linked" or "donut" pattern in the hybrid resist. Such a linked pattern is illustrated FIGS. 18, 19 and 20, where FIG. 19 is a cross section of the wafer in FIG. 18 taken along lines 19—19, and FIG. 20 is a cross section of the wafer in FIG. 18 taken along lines 20—20.

Figure 18:
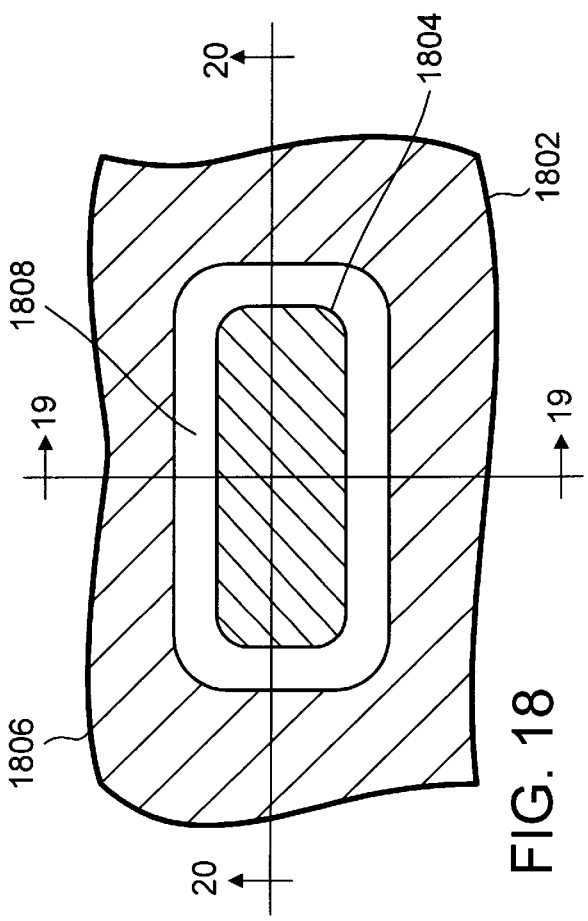
FIG. 18 is a top schematic view of a wafer portion with patterned hybrid resist upon it.

FIG. 18 shows a wafer portion 1802 upon which hybrid resist has been deposited, exposed through mask 1700 containing a blocking shape 1702 and developed. Hybrid resist portions which are unexposed (i.e., the inside region 1804 blocked by mask shape 1702) remain photoactive and insoluble in the developer and form positive tone line patterns. Hybrid resist portions which are exposed with high intensity radiation (i.e., the outside region 1806 not blocked by mask shape 1702) are completely cross-linked during the post exposure bake and form a negative tone line pattern. Hybrid resist portions which are exposed with intermediate amounts of intensity (i.e., the areas under the edges of mask shape 1702) become soluble in developer solution after the first exposure and are dissolved during the development step and form space 1808 in the hybrid resist.

Because portions of the hybrid resist were unexposed during the first exposure, these regions remain photoactive and now comprise positive tone resist patterns. Thus, by blanket exposing the wafer these positive tone resist patterns are polymerized and can be washed away during development. The blanket exposure is preferably an intermediate exposure, either by exposing at a low enough dose or for a short enough to create an intermediate response to those areas of resist that were unexposed (i.e., the positive tone patterns) in the first exposure step.

In the alternative, the positive tone portions can be removed by a selective etch using a solution of pure n-butyl acetate at room temperature or with a strong base, such as 0.35 Normal ("N") tetramethyl ammonium hydroxide ("TMAH").

Figure 22:
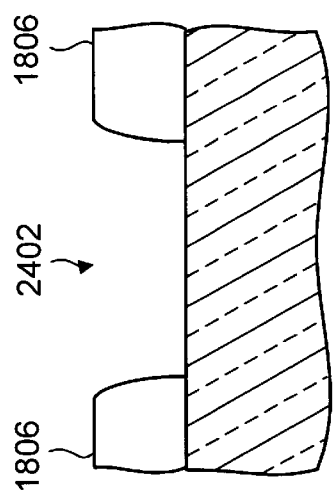
FIG. 22 is a cross-sectional side view of the wafer portion of FIG. 21 taken along line 22—22.
Figure 23:
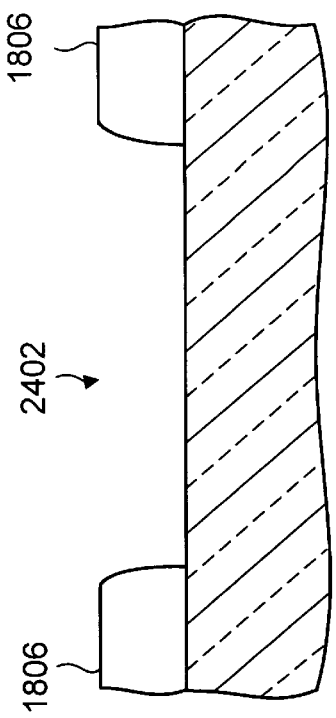
FIG. 23 is a cross-sectional side view of the wafer portion of FIG. 21 taken along line 23—23.
Figure 21:
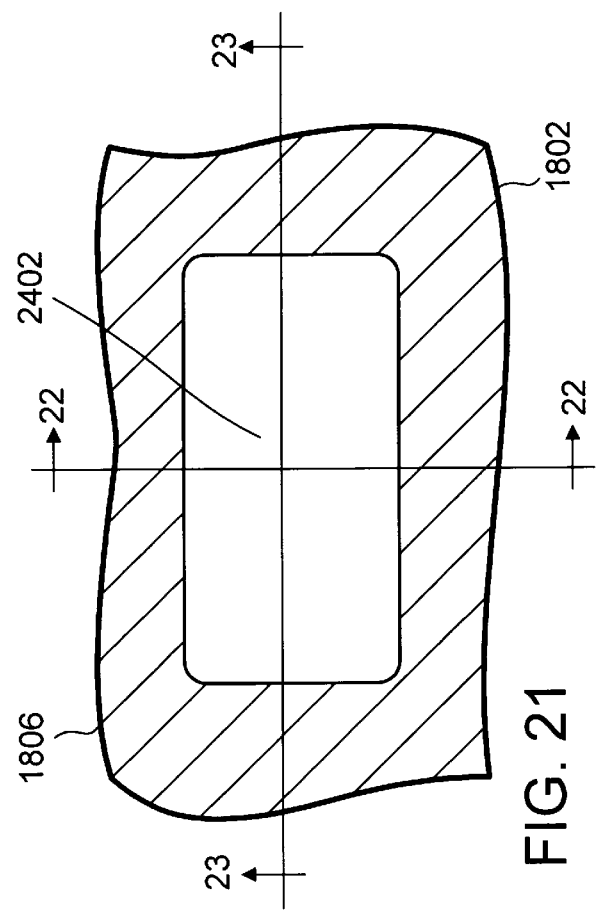
FIG. 21 is a top schematic view of a wafer portion with patterned hybrid resist and positive tone portions removed.
Figure 24:
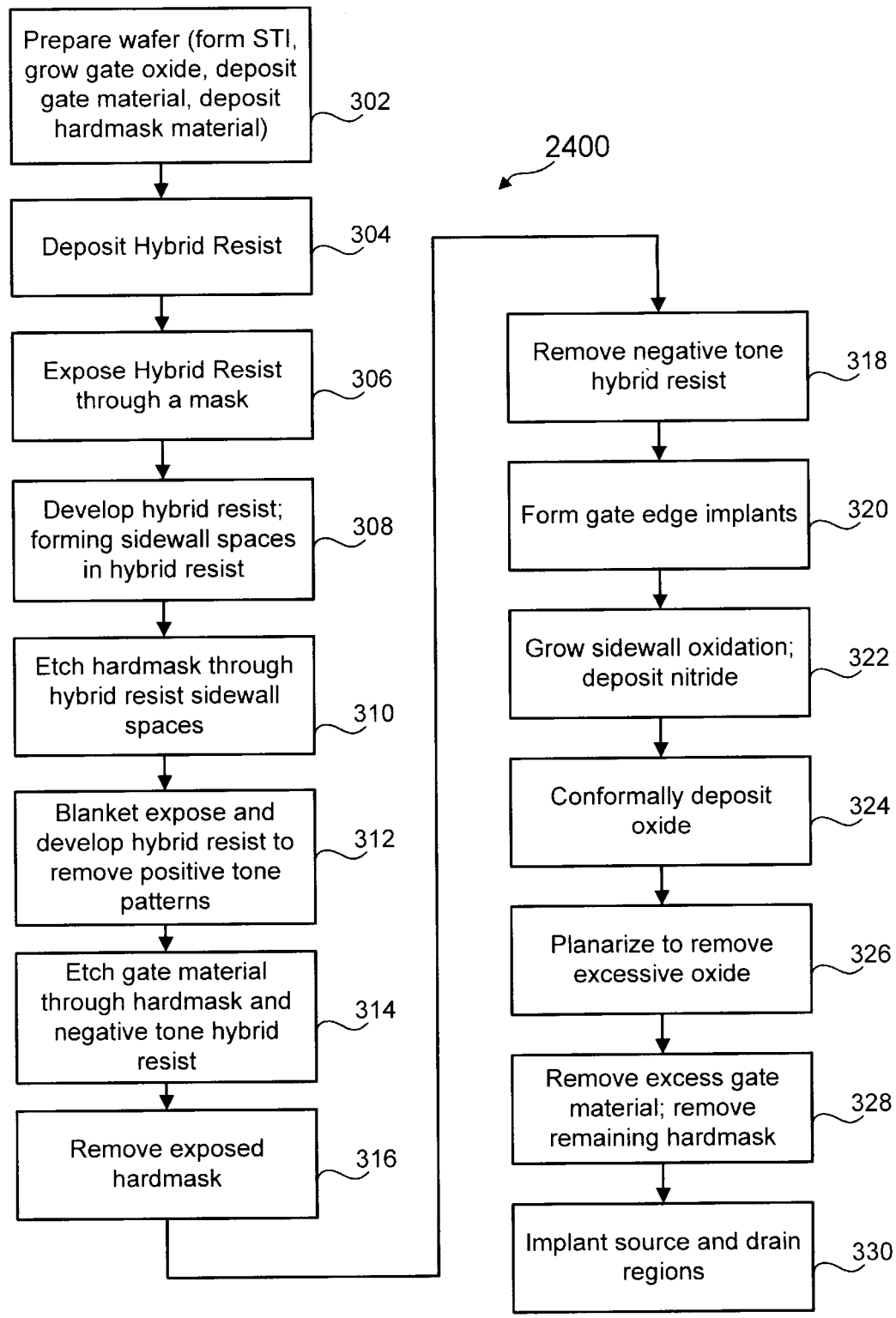
FIG. 24 is a flow diagram illustrating a preferred embodiment method.

Turning to FIGS. 21, 22, and 23, the wafer portion 1802 is illustrated after a blanket exposure and development, where FIG. 22 is a cross section of the wafer portion in FIG. 24 taken along lines 22—22, and FIG. 23 is a cross section of the wafer taken along lines 23—23.

The blanket exposure has caused the positive tone regions (i.e., the hybrid resist portion 1804 (of FIGS. 18, 19 and 20)) which were unexposed (i.e., blocked by mask shape 1702) to become soluble and wash away during development.

Turning to FIG. 24, a method 2400 for forming a field effect transistor (FET) that includes the definition of sidewall spacer regions and the formation of sidewall spacers using the unique properties of hybrid resist is illustrated. The first step 302 is to prepare the wafer for the fabrication of the FET. This would typically include the formation of isolation, such as shallow trench isolation (STI); the growing of gate oxide, the deposition of gate material (a suitable conductor such as polysilicon) and the deposition of a hardmask (suitably an inorganic material such as a nitride). The formation of STI regions is preferably done using the unique properties of hybrid resist as disclosed in sister application "Method of Defining Three Regions Using a Single Masking Step and Device Formed Thereby," Attorney Docket No. Bu9-96-149, Ser. No. 08/895,748, but any other suitable method for forming isolation regions could be used.

The next step 304 is to deposit hybrid resist, such as any of the hybrid resist formulations discussed above. Then, in step 306, the hybrid resist is exposed through a mask with shapes that define sidewall spacer regions. In the preferred embodiment, the mask shapes include edges that correspond to the sidewall spacer regions such that those areas of the hybrid resist are exposed to intermediate amounts of exposure. Areas of the hybrid resist not blocked during exposure and hence fully exposed become cross linked and form a negative tone pattern. Areas of the hybrid resist blocked during exposure remain unexposed and photoactive, and hence comprise a positive tone pattern. Then in step 308 the exposed hybrid resist is developed. This causes areas of intermediate exposure to develop away, forming sidewall spaces in the hybrid resist.

It should also be noted that one advantage in using hybrid resist is that intermediate exposure sidewall spaces formed under the edges of mask shapes can be printed with a width of less than 0.2 $\mu$m with current deep ultra violet (DUV) lithography tools that are designed for operation at 0.35 $\mu$m resolution. Thus, by using the edge of a mask shape to define spaces in hybrid resist, smaller dimension features can be created than normal lithography allows.

Figure 25:
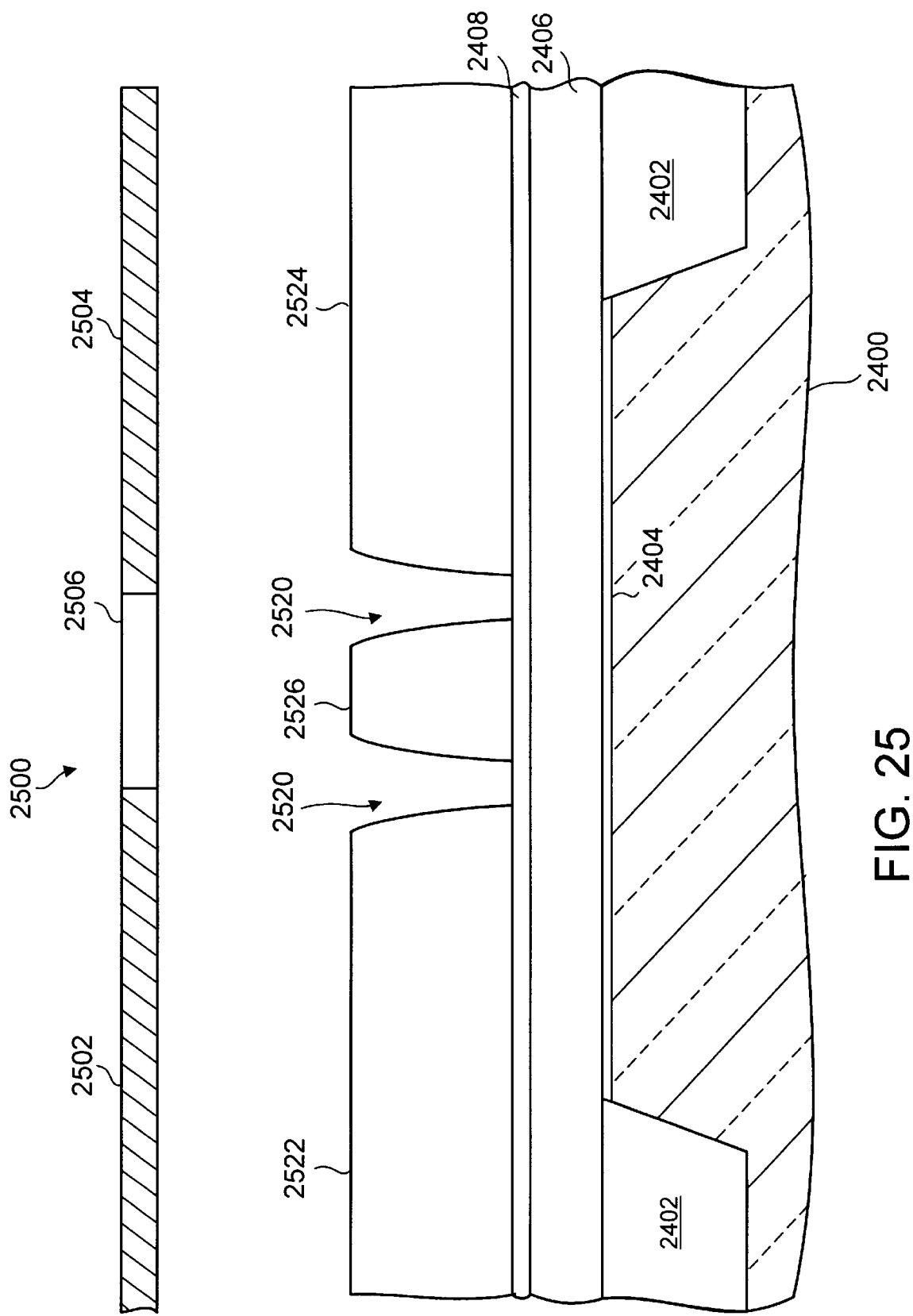
FIGS. 25–37 are cross-sectional side views of a wafer portion in fabrication in accordance with the preferred embodiment.

Turning to FIG. 25, a wafer portion 2400 is illustrated. The wafer portion includes two shallow trench isolation regions 2402 previously formed, a layer of gate oxide 2404, a gate material layer 2406, and a hardmask layer 2408, in accordance with step 302. A hybrid resist layer has been deposited, exposed through a mask portion 2500, and developed in accordance with steps 304–308. The mask portion 2500 includes two blocking shapes 2502 and 2504 which block the hybrid resist during exposure, and a non-blocking shape 2506. Thus, the areas of hybrid resist under the edges of blocking shapes 2502 and 2504 are exposed to intermediate amounts of exposure, and become soluble and wash away during development. This forms sidewall spaces 2520 in the hybrid resist.

Additionally, the hybrid resist portions which were unexposed in step 306 (i.e., the regions under blocking shapes 2502 and 2504) remain insoluble in the developer and form positive tone patterns 2522 and 2524 of hybrid resist. Hybrid resist portions which are exposed with high intensity radiation (i.e., the regions under non-blocking shape 2506) form a negative tone line patterns 2526 of hybrid resist.

Figure 26:
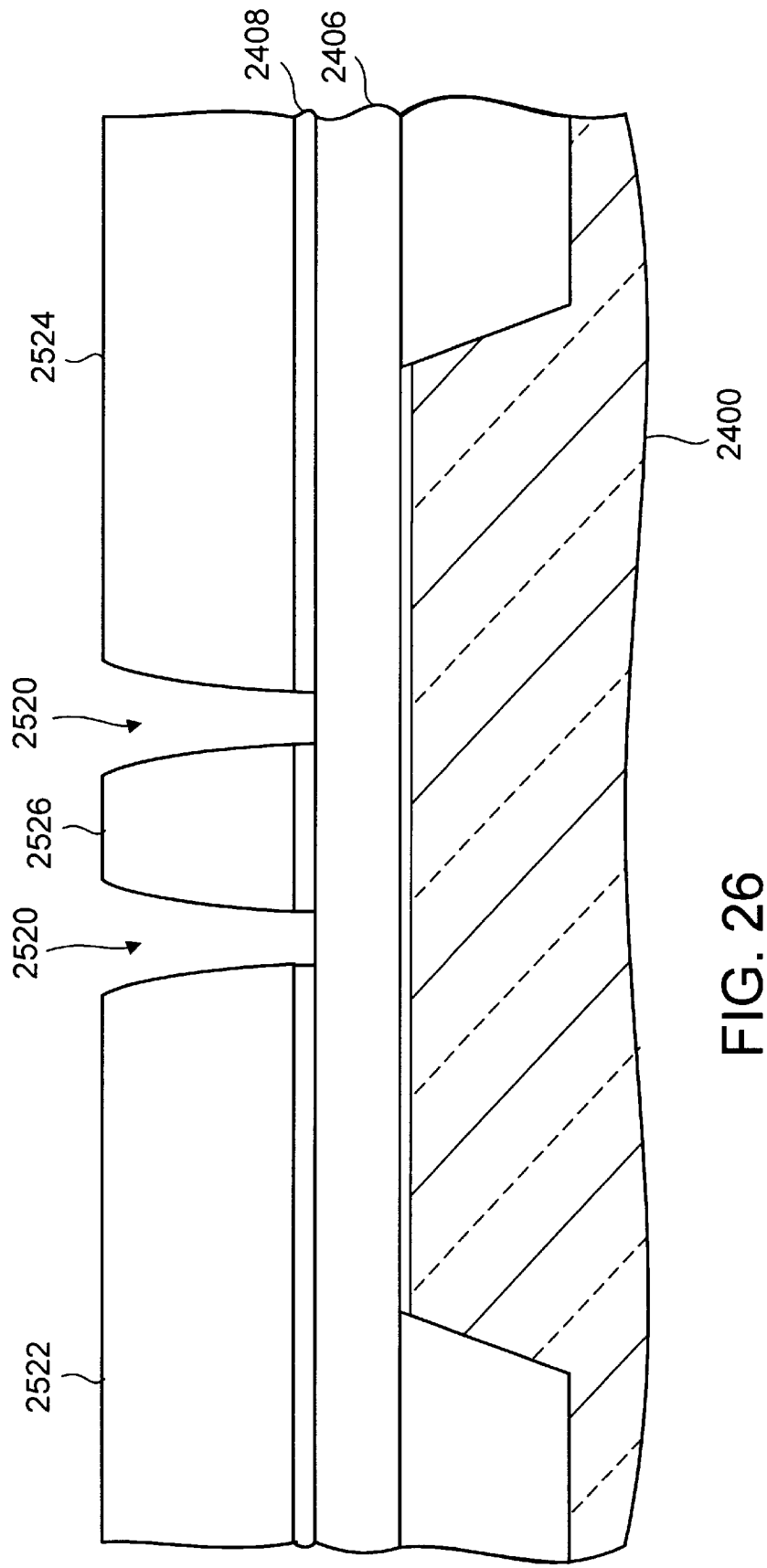

With the hybrid resist so patterned, the next step 310 is to etch the hardmask through the spaces in the hybrid resist. This etch is preferably done by a nitride reactive ion etch with $NF_3$ and argon or $CHF_3$ and $O_2$, but any suitable etch procedure that removes the hardmask without reacting with the positive tone portions of the hybrid resist could be used. Turning to FIG. 26, the wafer portion 2400 is illustrated with the hardmask layer 2408 etched away under the spaces 2520.

Figure 27:
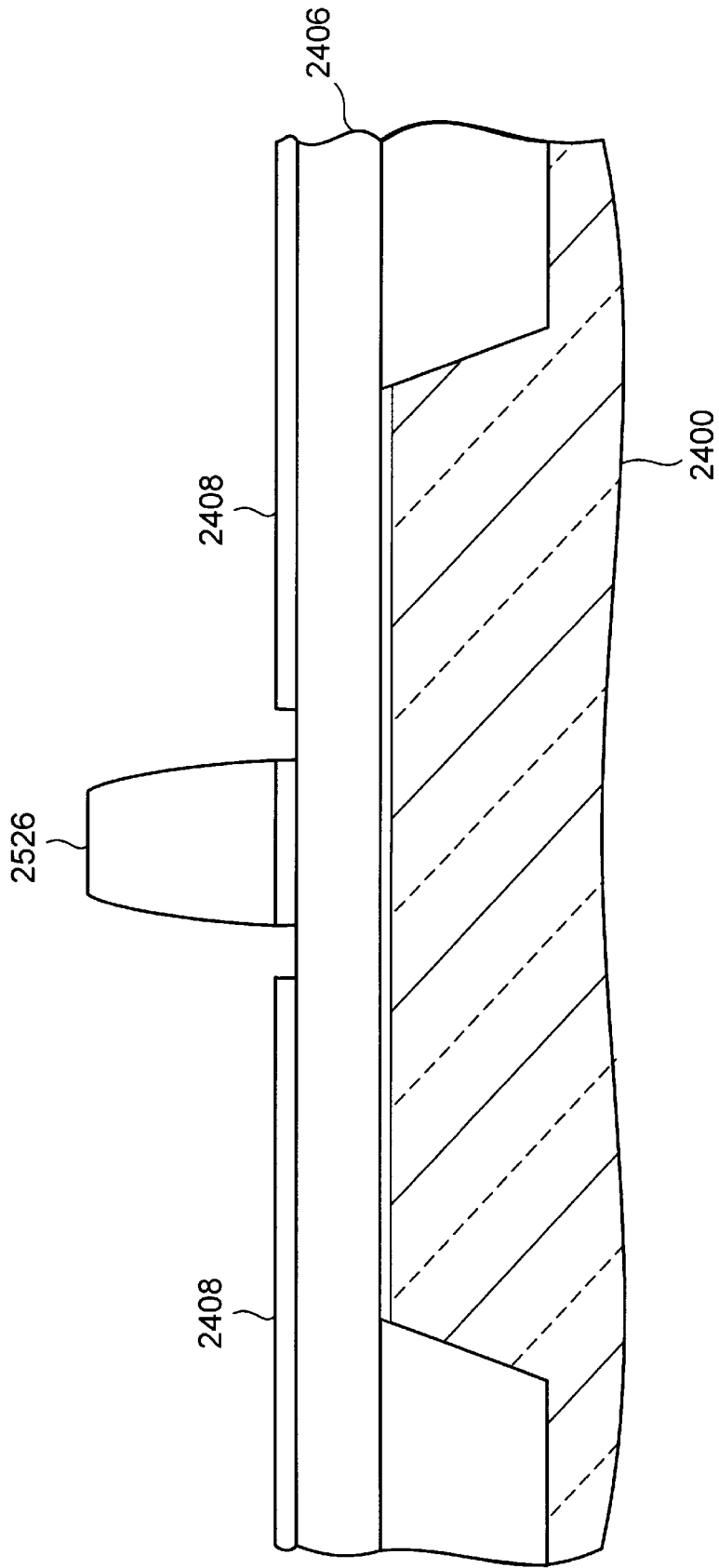

The next step 312 is to blanket expose the hybrid resist and develop. The blanket exposure is preferably an intermediate exposure, either by exposing at a low enough dose or for a short enough to create an intermediate response to those areas of resist that were unexposed (i.e., the positive tone patterns) in the first exposure step. This step causes the positive tone patterns of the hybrid resist to become soluble and wash away, while leaving the negative tone patterns of hybrid resist. Turning to FIG. 27, the wafer portion 2400 is illustrated with the positive tone patterns 2522 and 2524 developed away. This procedure does not damage the negative tone patterns 2526 of hybrid resist.

In the alternative, the positive tone portions can be removed by a selective etch using a solution of pure n-butyl acetate at room temperature or with a strong base, such as 0.35 Normal ("N") tetramethyl ammonium hydroxide ("TMAH"). This solvent could be tuned so that it would selectively remove the positive tone areas independent of the negative tone areas, which are cross-linked and are therefore generally insoluble. Again, this would reduce the potential for problems with the positive tone resist areas remaining photoactive through the nitride etch process and does not require additional processing steps.

The next step 314 is to etch the gate material through the remaining hybrid resist and the remaining hardmask to define sidewall spacer troughs in the gate material layer. This etching is preferably done using a halogen/oxygen mixtures such as chlorine/He/$O_2$, but could also be accomplished with any other suitable etch procedure. This step defines the sidewall spacer troughs through which implants can be formed in the underlying silicon and which the sidewall spacers will be formed.

Figure 28:
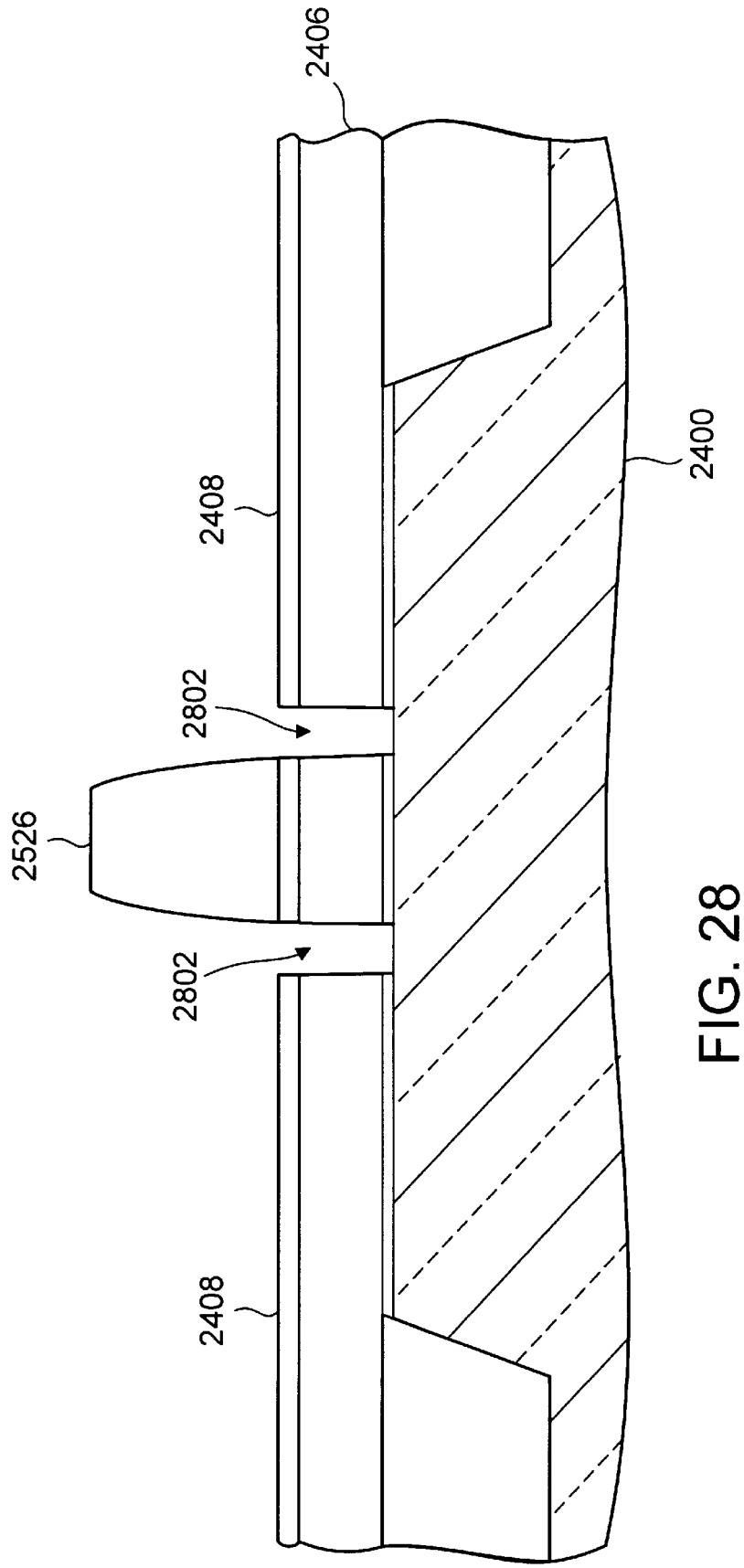

Turning to FIG. 28, the wafer portion 2400 is illustrated with sidewall spacer troughs 2802 formed in the gate material layer 2406 and the gate oxide layer 2404. The remaining negative tone pattern 2526 and the remaining hardmask layer 2408 both serve to mask the etch step that forms the sidewall spacer troughs 2802. Because the sidewall spacer troughs 2802 were defined using hybrid resist, they can be formed smaller than conventional lithography allows. This facilitates the formation of sidewall spacer troughs 2802 that have a smaller feature size than could be created with conventional methods. This allows precise control of implants into the wafer and precise control of the sidewall spacer width.

The next step 316 is to remove the exposed hard mask. This is preferably done by etching the nitride and oxide selective to the remaining negative tone hybrid resist pattern.

Figure 29:
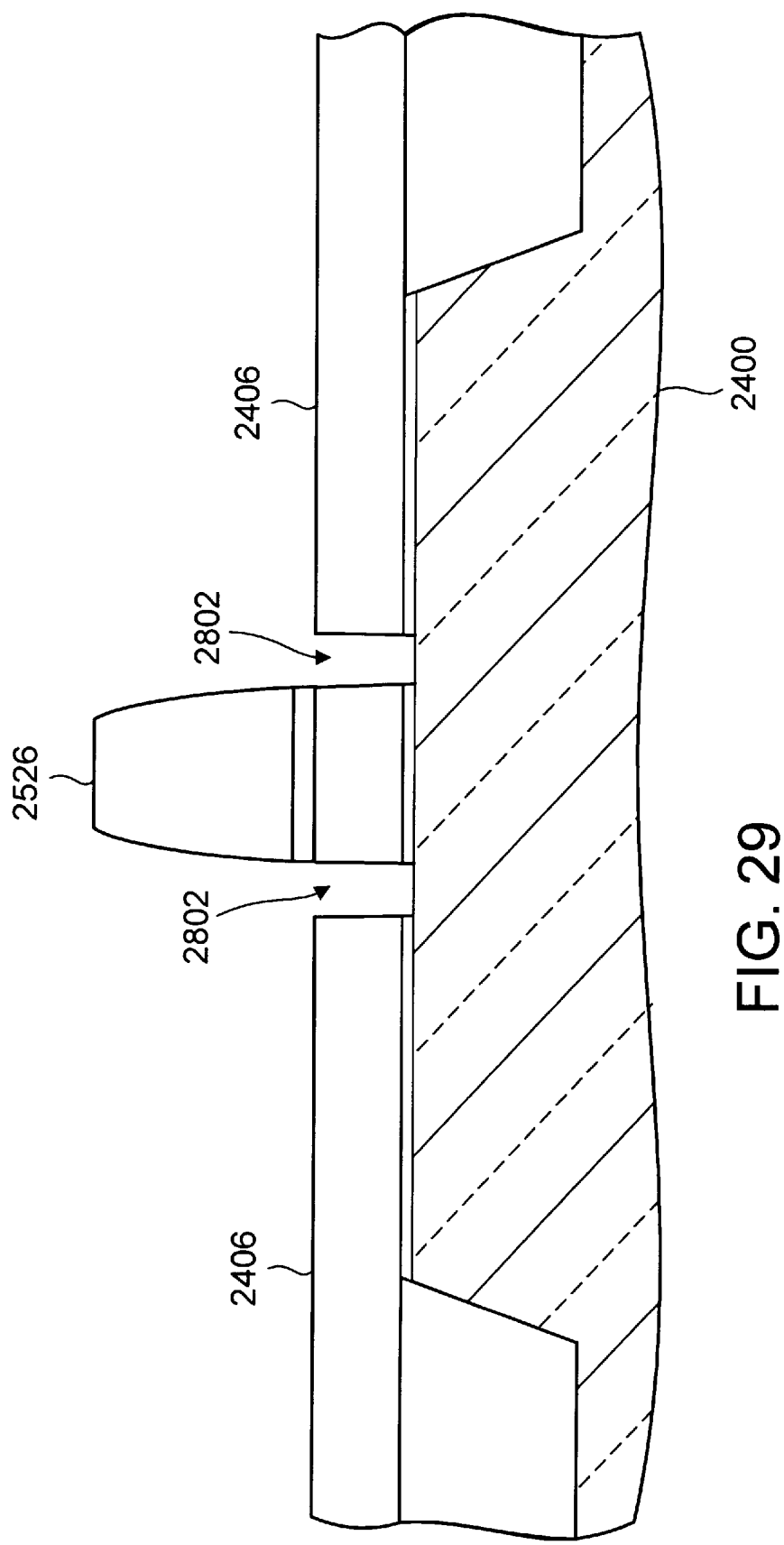

Turning to FIG. 29, the wafer portion 2400 is illustrated with the exposed portions of hardmask layer 2408 removed where it was not protected by the negative tone pattern 2526 of hybrid resist.

Figure 30:
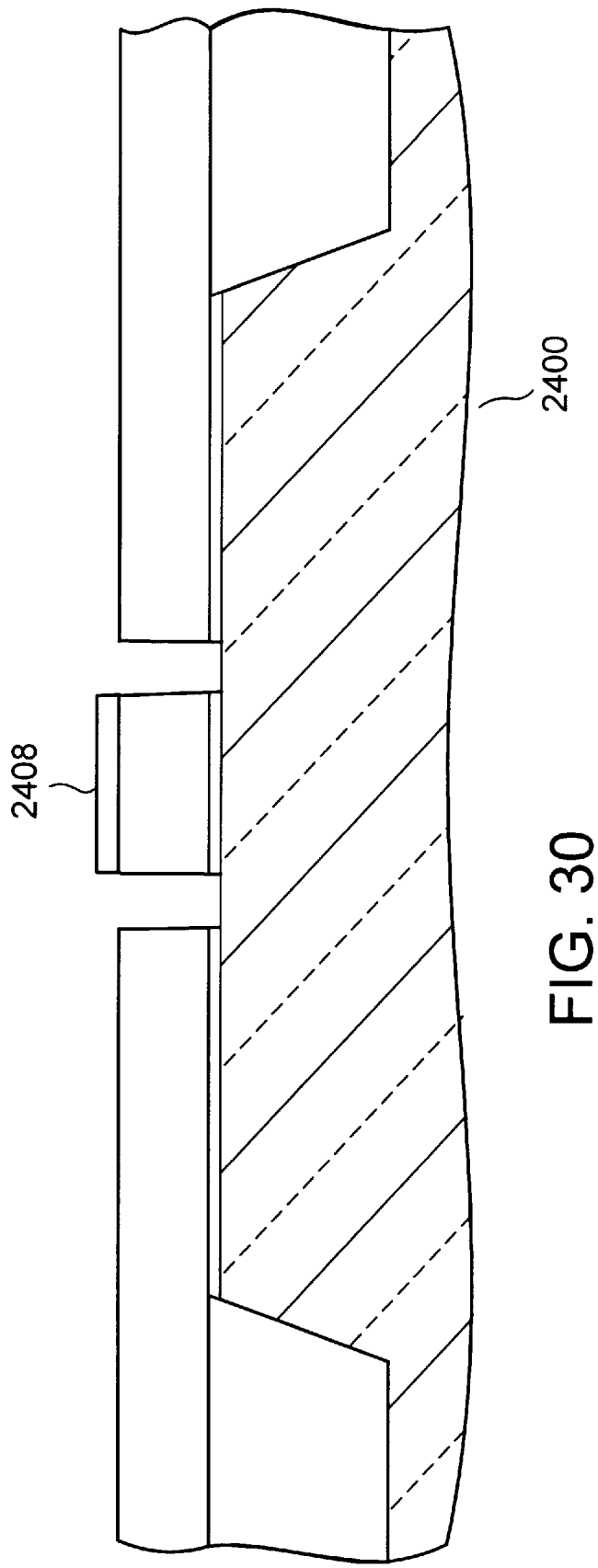

The next step 318 is remove the remaining negative tone hybrid resist. This is generally done by the stripping the resist using a plasma resist strip. This exposes the remaining hardmask over the field effect transistor gate. Turning to FIG. 30, the wafer portion 2400 is illustrated. The negative tone pattern 2526 has been removed, exposing the remaining portion of hardmask 2408 which covers the patterned gate material.

The next step 320 is to form gate edge implants. Because the preferred embodiment has formed sidewall spacer troughs of a minimum feature size at the edges of the gate, a very precise gate edge implant to tailor the doping at the gate edge can be made. By contrast, without additional masking steps the prior art method which uses a traditional conformal deposition/directional etch sidewall spacer only had a limited ability to selectively tailor the doping at the gate edge. In particular, the prior art only had the ability to implant across the entire active area (except where blocked by the gate), then form the sidewall spacer, and implant again across the entire active area (except where blocked by the gate and sidewall spacers). Thus, any dopant added to the gate edge also had to be added across the entire active area. This severely limited the type of implants that could be made.

The gate edge implants can be any type of implant designed to improve the performance of the FET. In the preferred embodiment, a lightly doped implant is formed followed by a halo implant. The lightly doped implant preferably comprises a dopant of the same species as the source and drain regions with a doping density between $1 \times 10^{13}$ and $5 \times 10^{15}$ ions/cm$^2$, with a preferred doping density of approximately $1 \times 10^{14}$ ions/cm$^2$. The halo comprises a dopant of the opposite species of the lightly doped implant, implanted slightly deeper than the lightly doped implant. The halo causes the background doping at the lightly doped implant/substrate transition to be slightly higher than it would be normally.

The lightly doped implant improves the operation of the FET by channeling the device current to the surface of the FET. The halo helps reduce short channel effects (i.e., threshold voltage rolloff, punchthru).

By contrast, in prior art methods where any implants made had to be made across the entire active area, any similar implants would result in excessive junction capacitance by creating a bigger capacitor.

Figure 31:
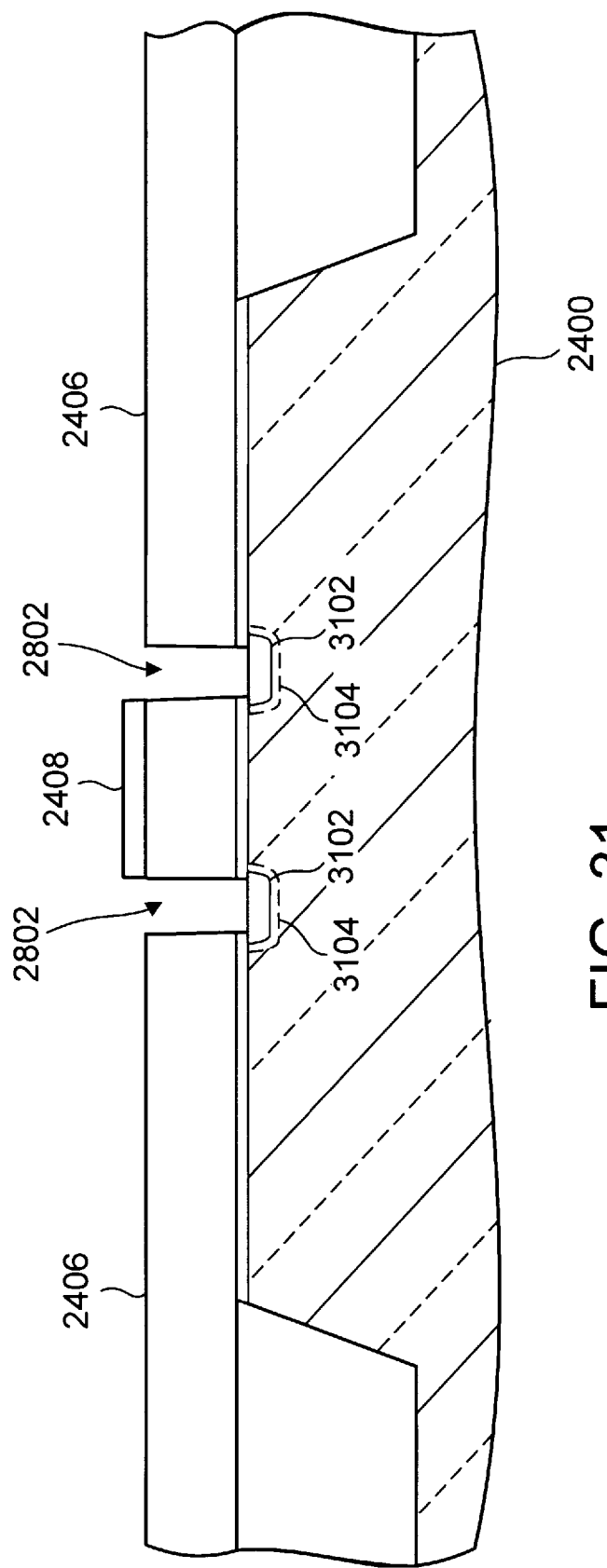

Turning to FIG. 31, the wafer portion 2400 is illustrated with gate edge lightly doped implants 3102 and gate edge halo implants 3104 formed at the edges of the gate. The width of these implants is defined by the sidewall spacer troughs 2802 formed in the polysilicon gate material 2406 by the hybrid resist process. Thus both the gate edge lightly doped implants 3102 and the gate edge halo implants 3104 can be precisely defined.

Figure 32:
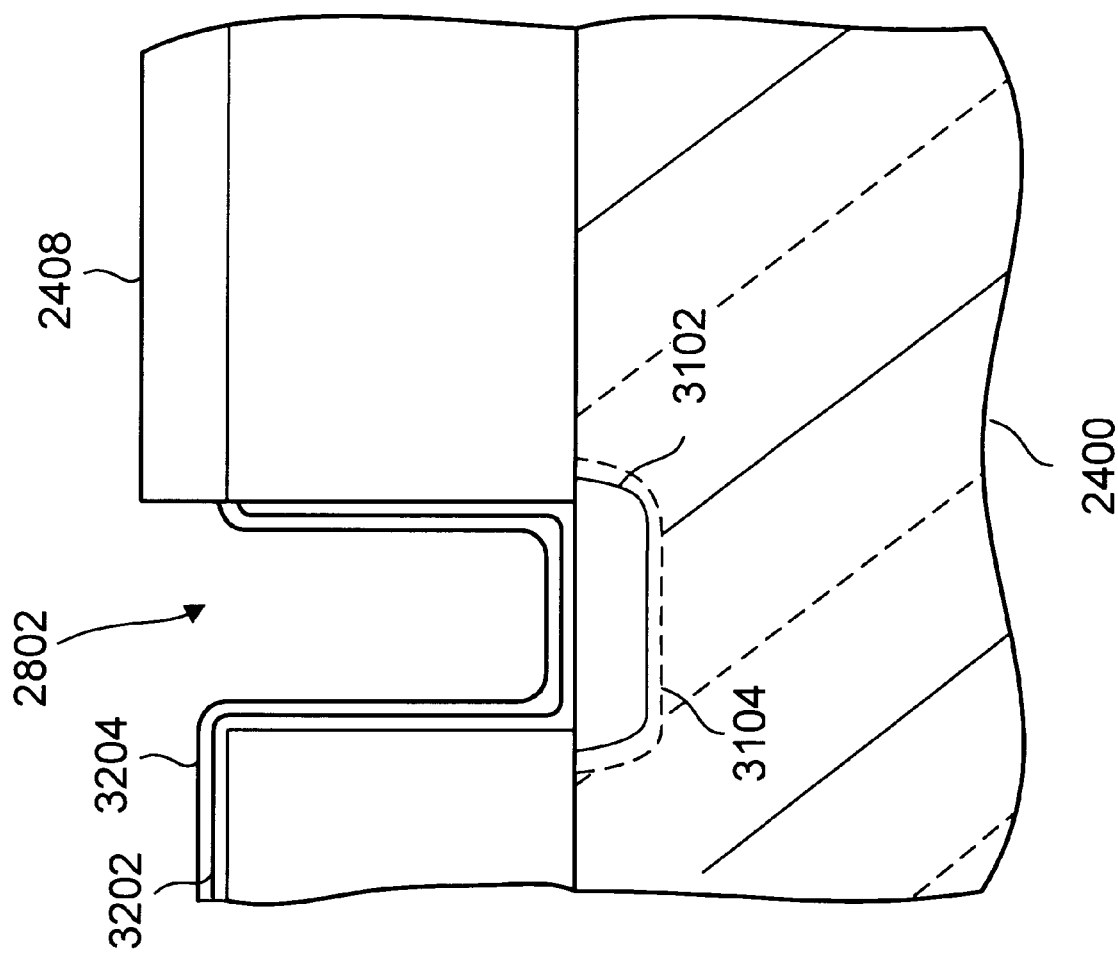

The next step 322 is to grow sidewall oxidation and deposit a thin nitride stop layer in the sidewall spacer troughs 2802. As will be explained later, this step is optional, but is desirable to prevent the possibility of unwanted gate material etching during planarization. Turning to FIG. 32, a close up of wafer portion 2400 is illustrated with sidewall oxidation layer 3202 and a nitride stop layer 3204 formed in the sidewall spacer trough 2802.

The next step 324 is to conformally deposit the sidewall spacer material. This material would suitable comprise any dielectric material, such as silicon dioxide or silicon nitride. Because the conformal deposition results in the sidewall spacer troughs filling from the side, a minimal amount of sidewall spacer material needs to be deposited. In particular, the sidewall spacer trough will generally fill with a material deposition of only slightly more than ½ the width of the sidewall spacer trough, which can comprise a very small size because of the inherent capabilities of hybrid resist. This allows the deposition thickness to scale to smaller dimensions than is allowable using the current art. Because minimal material is deposited, minimal remove of material is required in later planarization.

Figure 33:
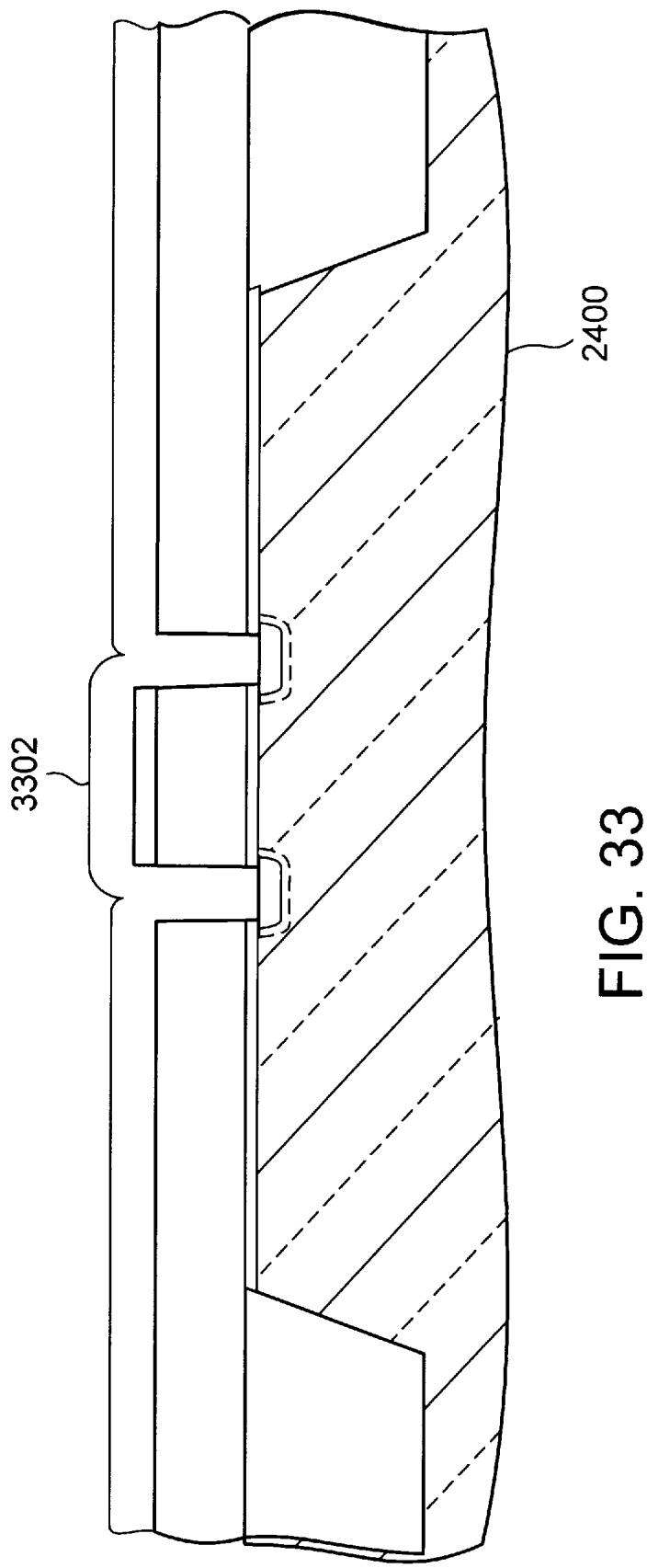

Turning to FIG. 33, the wafer portion 2400 is illustrated with a conformal deposition of a sidewall spacer material layer 3302. In the preferred embodiment, the sidewall spacer material comprises silicon dioxide, but could also comprise any other suitable material. The sidewall spacer material layer 3302 fills the sidewall spacer troughs 2802 as it is conformally deposits across the wafer.

The next step 326 is to remove the excess sidewall spacer material. Preferably this is done by first performing a chemical mechanical polish (CMP). The remaining portions of the hardmask will serve as a polish stop. It may be possible to use a sufficiently soft polish pad with an appropriate chemistry to completely remove the oxide from the remaining non-gate polysilicon areas. However, in most cases some residual sidewall spacer material will remain in areas close to the gates while large the open areas will polish down to the remaining non-gate polysilicon.

This will require a second removal step to remove the remaining portions of sidewall spacer material. This removal would typically be done by using a etch process selective to the hardmask material. In the case where the sidewall spacer material comprises silicon oxide and the hardmask comprises a nitride, the etch would preferably comprise halogen/oxygen mixtures such as chlorine/He/O$_2$ or a selective wet etch like KOH. It should be noted that care should be taken in this etch procedure to ensure that portions of the gate polysilicon under the hardmask are not inadvertently etched by this procedure. In particular, as the etch removes spacer material, eventually the side of the gate polysilicon under the hardmask will be exposed. The etch used to remove the sidewall spacer material could etch away the gate as well, damaging the gate structure. As discussed before, the preferred method for avoiding this issue involves forming a nitride liner in the sidewall spacer trough as part of step 322 as illustrated in FIG. 32. By performing this etch selective to nitride the preservation of the polysilicon gate material under the hardmask is assured.

Figure 34:
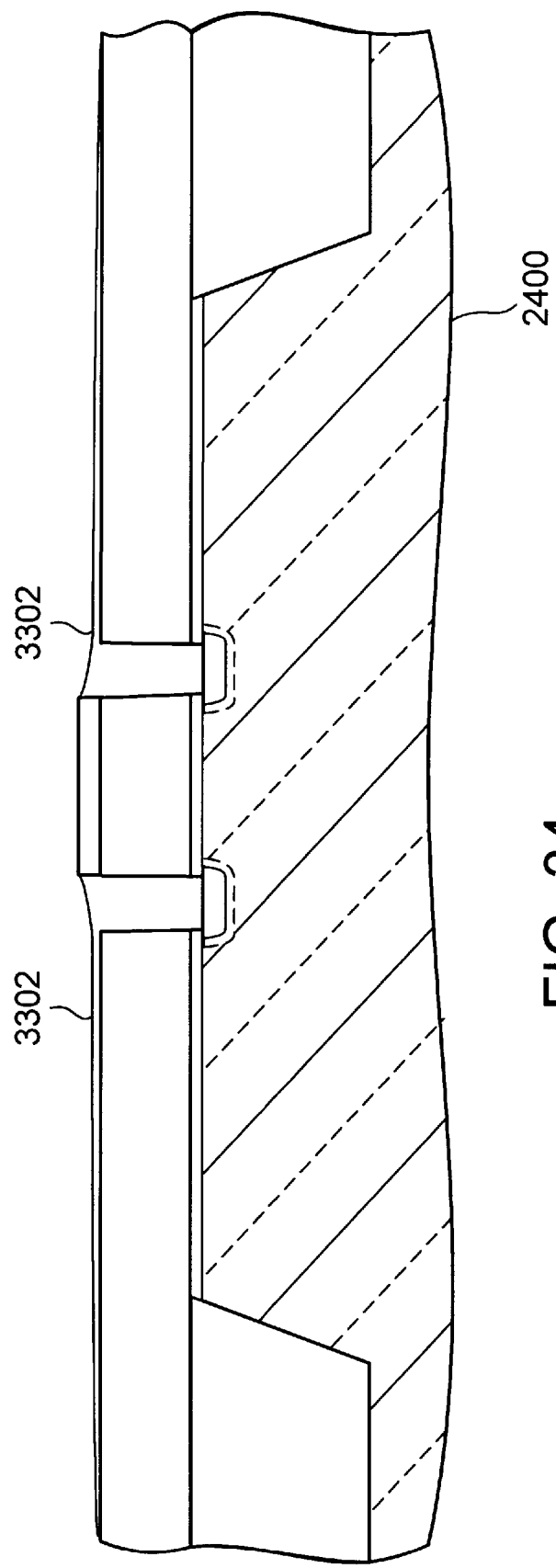

Turning to FIG. 34, the wafer portion 2400 is illustrated with the excessive sidewall spacer material layer 3302 removed with a CMP. The CMP removes the sidewall spacer material 3302 from the hard mask over the gate polysilicon, but some residual sidewall spacer material 3302 remains over the non-gate polysilicon.

Figure 35:
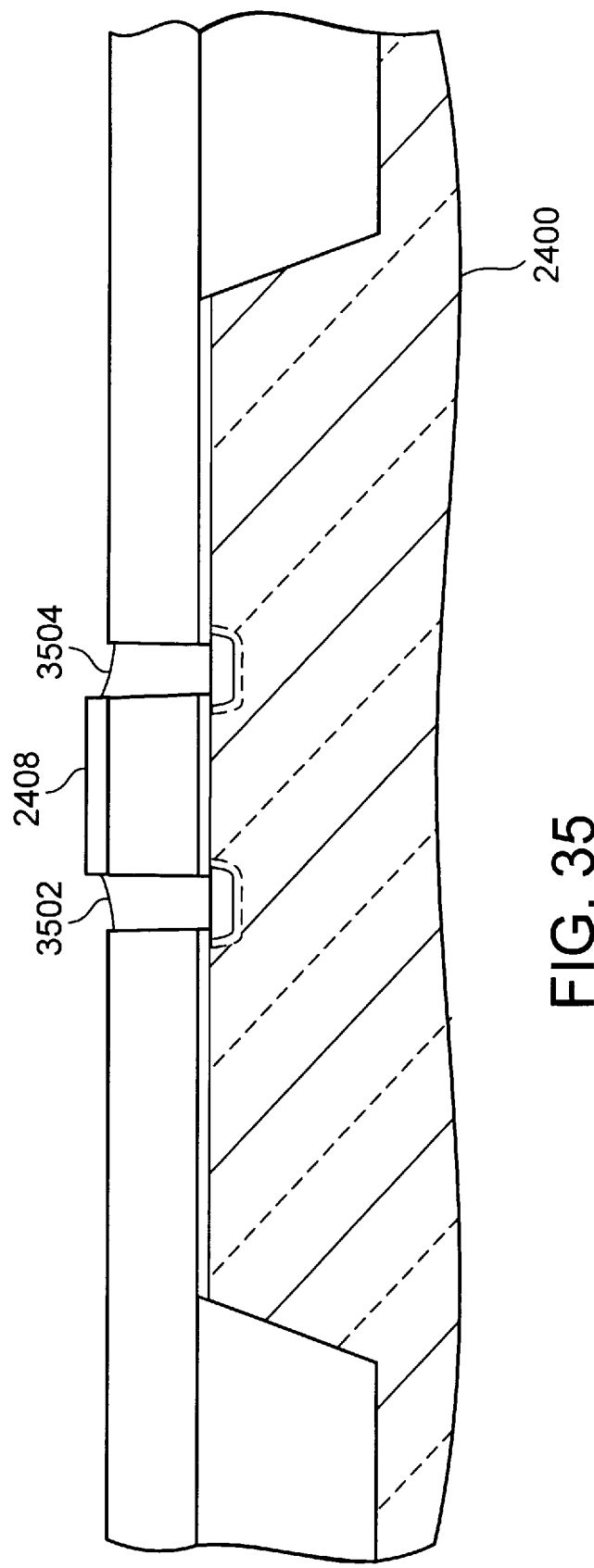

Turning to FIG. 35, the wafer portion 2400 is illustrated with the remaining excessive sidewall spacer material 3302 is removed by an etch procedure. This leaves sidewall spacer material 3302 only in the sidewall spacer troughs 2804, and thus forms sidewall spacers 3502 and 3504.

The next step 328 is to remove the remaining excess gate material. This non-gate polysilicon can generally be removed by etching selective to the sidewall spacer material and to hardmask material which covers the gate polysilicon. The remaining hardmask material over the gate polysilicon is then removed. These removal steps typically will comprise a nitride etch, but could also comprise any other suitable etch procedure.

Figure 36:
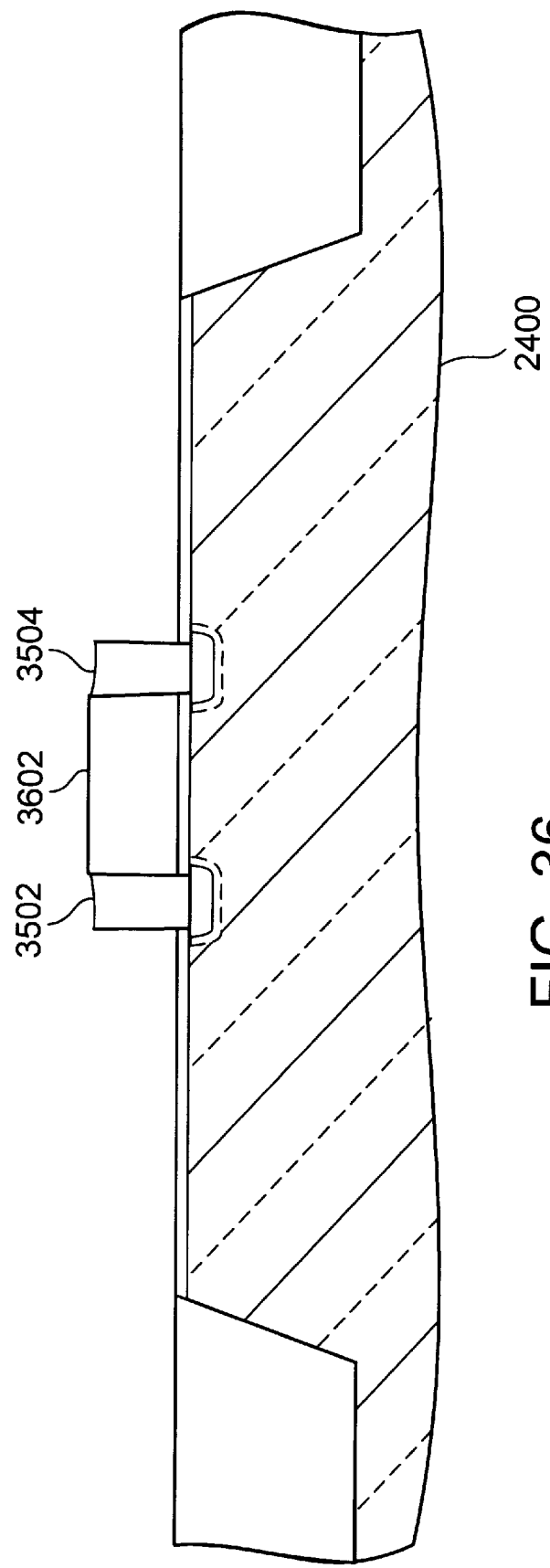
Figure 37:
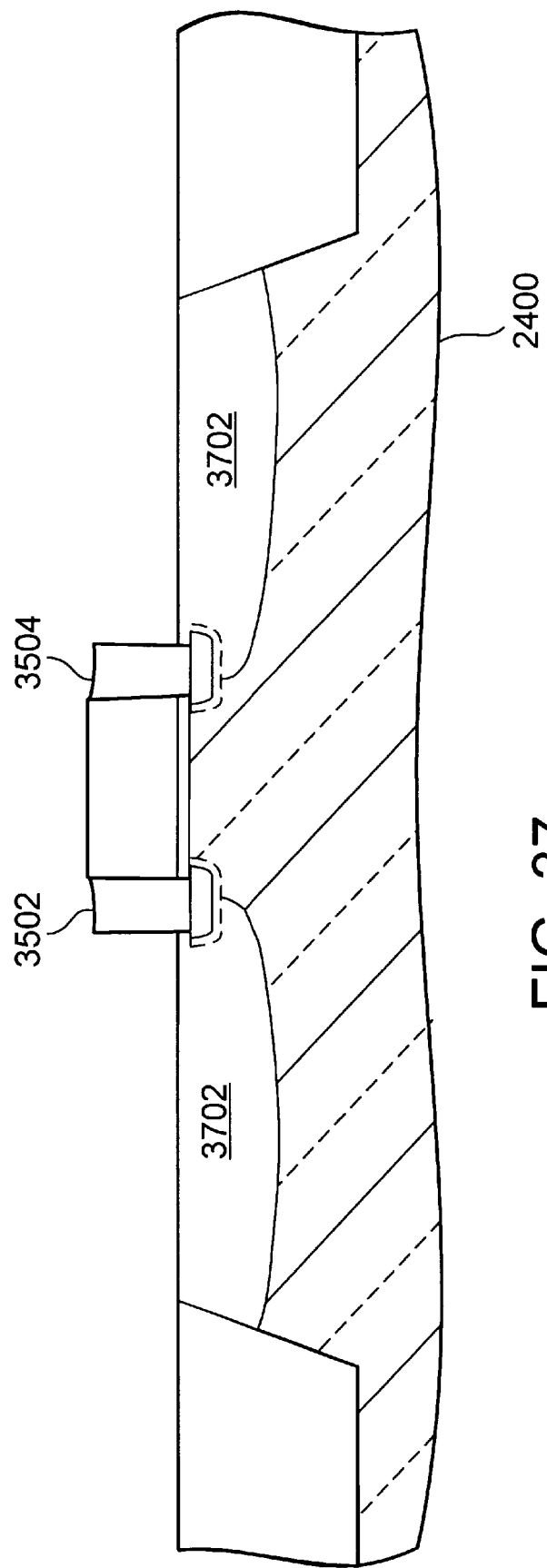
Figure 38:
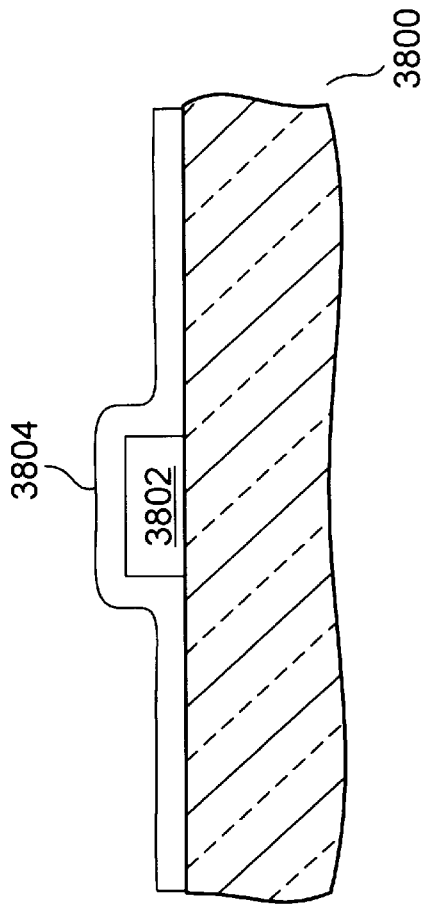
FIGS. 38 and 39 are a cross sectional side view of prior art sidewall spacers.
Figure 39:
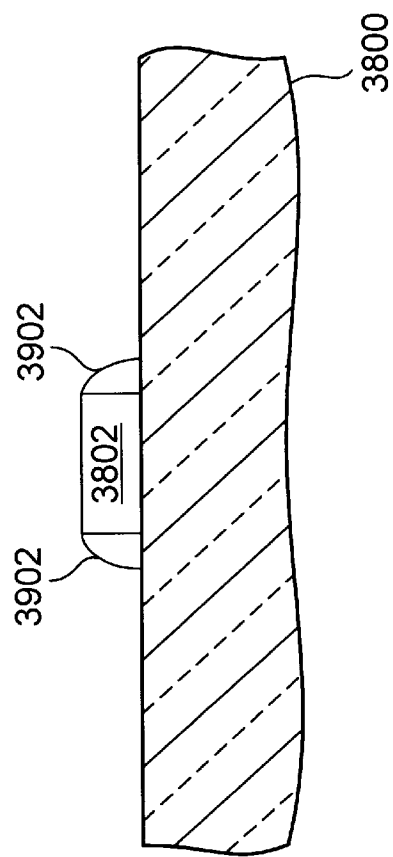

Turning to FIG. 36, the wafer portion 36 is illustrated with the non-gate polysilicon and the hardmask over the gate polysilicon removed. This leaves on the gate polysilicon 3602, and the sidewall spacers 3502 and 3504.

The next step 330 is to implant the source and drain regions. The regions for these implants are determined by the sidewall spacers and the gate material. Thus, as in the prior art methods, the source and drain regions are self aligned with the gate and sidewall spacers. It should be noted that sidewall spacers 3502 and 3504 have a more vertical side shape than sidewall spacers made using prior art methods, and this can offer an improvement for source and drain regions defined by an angle implant.

Thus, the preferred embodiments capitalize on the unique properties of hybrid resist to define sidewall spacer regions troughs, form implants through the sidewall spacer troughs, and then form the sidewall spacers in the troughs. The preferred embodiments allows gate edge doping to be more accurately controlled than the prior art without requiring additional masking steps by allowing selective doping only through the sidewall spacer troughs instead of across the entire active area. Additionally, the preferred embodiment allows the width of the sidewall spacer to be determined independent of the gate material depth.

While the invention has been particularly shown and described with reference to an exemplary embodiment using hybrid resist to form sidewall spacers in for use in a field effect transistor, those skilled in the art will recognize that the preferred embodiment can be applied to other applications where sidewall spacers are desirable, and that various changes in form and details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe).

We claim:

1. A method for forming a sidewall spacer on a substrate, the method comprising the steps of:
   a) depositing a layer of hybrid resist on said semiconductor substrate;
   b) exposing said hybrid resist layer through a mask containing a plurality of shapes such that first portions of said hybrid resist are exposed to a first exposure level, second portions of said hybrid resist are exposed to a second exposure level, and third portions of said hybrid resist are exposed to a third exposure level, wherein said second exposure level results from diffraction effects at the edges of said plurality of shapes;
   c) developing said hybrid resist layer such that said second portions of said hybrid resist are removed, said removal of said second portions exposing a first region of said substrate;
   d) etching said first region of said substrate to form a sidewall spacer trough;
   e) depositing a sidewall spacer material in said trough;
   f) removing said first portions of said hybrid resist, said removal exposing a second region of said substrate, while a third region of said substrate remains covered by said third portions of said hybrid resist;
   g) removing said second region of said substrate, such that said sidewall spacer material remains adjacent to said third region of said substrate.

2. The method of claim 1 wherein the step of removing said first portions of hybrid resist comprises the steps of:
   i) blanket exposing said hybrid resist wafer such that said first portions of said hybrid resist are made soluble; and
   ii) developing away said first portions of said hybrid resist.

3. The method of claim 2 wherein the step of blanket exposing comprises an exposure at an intermediate exposure level.

4. The method of claim 1 wherein the step of removing said first portions of said hybrid resist comprises dissolving said first portions of said hybrid resist in a solvent that will not dissolve the third portions of said hybrid resist.

5. The method of claim 4 wherein the solvent is selected from the group consisting of:
   n-butyl acetate and tetramethyl ammonium hydroxide.

6. The method of claim 1 wherein the first level of exposure comprises substantially no exposure, wherein said second level of exposure comprises an intermediate exposure, and wherein said third level of exposure comprises a full exposure.

7. The method of claim 6 wherein the first level of exposure leaves said first portion of hybrid resist photoactive, wherein said second level of exposure makes said second portion of hybrid resist soluble in developer and wherein said third level of exposure cross links said third portion of said hybrid resist making it insoluble in developer and no longer photoactive.

8. The method of claim 1 further comprising the step of providing a hardmask on said substrate, and wherein the step of depositing hybrid resist comprises depositing hybrid resist on said hardmask, and wherein the steps of a etching sidewall spacer trough and removing said first portions of said hybrid resist comprises etching said hardmask, removing said first portions of said hybrid resist, and etching said substrate selective to said third portions of hybrid resist and said hardmask.

9. The method of claim 8 wherein said hard mask comprises a nitride.

10. The method of claim 1 wherein the step of depositing sidewall spacer material comprises forming a sidewall oxide layer in said trough, forming a nitride layer over said sidewall oxide layer, and filling said sidewall spacer trough with a deposition of oxide over said nitride layer.

11. The method of claim 1 further comprising the steps of forming an implant through said sidewall spacer troughs into said substrate.

12. The method of claim 1 wherein said semiconductor substrate comprises a transistor gate material layer on a silicon wafer, and wherein said sidewall spacer troughs are etched through said gate material layer and wherein said third region of said semiconductor substrate comprises a gate for a transistor.

13. The method of claim 12 wherein said transistor gate material comprises polysilicon.

14. The method of claim 12 further comprising the step of forming a gate edge implant through said sidewall spacer trough.

15. The method of claim 14 wherein said forming a gate edge implant comprises forming a lightly doped gate edge implant and forming a halo implant deeper than said lightly doped implant.

16. A method for forming a transistor on a substrate, the method comprising the steps of:
   a) depositing a layer of hybrid resist on said semiconductor substrate;
   b) exposing said hybrid resist layer through a mask containing a plurality of shapes such that first portions of said hybrid resist are exposed to a first exposure level, second portions of said hybrid resist are exposed to a second exposure level, and third portions of said hybrid resist are exposed to a third exposure level, wherein said second exposure level results from diffraction effects at the edges of said plurality of shapes;

c) developing said hybrid resist layer such that said second portions of said hybrid resist are removed, said removal of said second portions exposing a first region of said substrate;

d) etching said first region of said substrate to form a sidewall spacer trough;

e) forming an implant in said substrate through said sidewall spacer trough;

f) depositing a sidewall spacer material in said trough;

g) removing said first portions of said hybrid resist, said removal exposing a second region of said substrate, while a third region of said substrate remains covered by said third portions of said hybrid resist;

h) removing said second region of said of said substrate, such that said sidewall spacer material remains adjacent to said third region of said substrate, said third region of said substrate comprising a gate for said transistor; and i) implanting a source and drain region in said substrate.

17. The method of claim 16 wherein the step of removing said first portions of hybrid resist comprises the steps of:

i) blanket exposing said hybrid resist wafer such that said first portions of said hybrid resist are made soluble; and ii) developing away said first portions of said hybrid resist.

18. The method of claim 17 wherein the step of blanket exposing comprises an exposure at an intermediate exposure level.

19. The method of claim 16 wherein the step of removing said first portions of said hybrid resist comprises dissolving said first portions of said hybrid resist in a solvent that will not dissolve the third portions of said hybrid resist.

20. The method of claim 19 wherein the solvent is selected from the group consisting of:

n-butyl acetate and tetramethyl ammonium hydroxide.

21. The method of claim 16 wherein the first level of exposure comprises substantially no exposure, wherein said second level of exposure comprises an intermediate exposure, and wherein said third level of exposure comprises a full exposure.

22. The method of claim 21 wherein the first level of exposure leaves said first portion of hybrid resist photoactive, wherein said second level of exposure makes said second portion of hybrid resist soluble in developer and wherein said third level of exposure cross links said third portion of said hybrid resist making it insoluble in developer and no longer photoactive.

23. The method of claim 16 further comprising the step of providing a hardmask on said substrate, and wherein the step of depositing hybrid resist comprises depositing hybrid resist on said hardmask, and wherein the steps of a etching sidewall spacer trough and removing said first portions of said hybrid resist comprises etching said hardmask, removing said first portions of said hybrid resist, and etching said substrate selective to said third portions of hybrid resist and said hardmask.

24. The method of claim 23 wherein said hard mask comprises a nitride.

25. The method of claim 16 wherein the step of depositing sidewall spacer material in said sidewall spacer trough comprises forming a sidewall oxide layer in said trough, forming a nitride layer over said sidewall oxide layer, and filling said sidewall spacer trough with a deposition of oxide over said nitride layer.

26. The method of claim 16 wherein said substrate comprises a layer of polysilicon over a silicon wafer.

27. The method of claim 16 wherein said forming a gate edge implant comprises forming a lightly doped gate edge implant and forming a halo implant deeper than said lightly doped implant.

* * * * *